United States Patent
Ogura et al.

(10) Patent No.: US 8,319,314 B2
(45) Date of Patent: Nov. 27, 2012

(54) SEMICONDUCTOR DEVICE

(75) Inventors: Tsuneo Ogura, Kanagawa (JP);
Masakazu Yamaguchi, Kanagawa (JP);
Tomoki Inoue, Tokyo (JP); Hideaki Ninomiya, Kanagawa (JP); Koichi Sugiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/005,589

(22) Filed: Jan. 13, 2011

(65) Prior Publication Data

US 2011/0101417 A1 May 5, 2011

Related U.S. Application Data

(60) Division of application No. 12/249,573, filed on Oct. 10, 2008, now abandoned, which is a continuation of application No. 10/974,810, filed on Oct. 28, 2004, now Pat. No. 7,456,487.

(30) Foreign Application Priority Data

May 28, 2004 (JP) .................................. 2004-159468

(51) Int. Cl.
*H01L 29/739* (2006.01)
*H01L 27/082* (2006.01)
*H01L 29/00* (2006.01)
*H01L 21/02* (2006.01)

(52) U.S. Cl. .. 257/566; 257/564; 257/588; 257/E29.201

(58) Field of Classification Search .......................... None
See application file for complete search history.

(56) References Cited

U.S. PATENT DOCUMENTS 4,893,160 A * 1/1990 Blanchard ..................... 257/334
4,992,390 A * 2/1991 Chang ........................... 438/270

(Continued)

FOREIGN PATENT DOCUMENTS

JP 08-274301 * 10/1996

(Continued)

OTHER PUBLICATIONS

Japanese Office Action issued Aug. 26, 2011, in Patent Application No. 2004-159468. (with English Translation).

(Continued)

*Primary Examiner* — Hoang-Quan Ho
(74) *Attorney, Agent, or Firm* — Oblon, Spivak, McClelland, Maier & Neustadt, L.L.P.

(57) ABSTRACT

A semiconductor device comprises a first base layer of a first conductivity type; a plurality of second base layers of a second conductivity type, provided on a part of a first surface of the first base layer; trenches formed on each side of the second base layers, and formed to be deeper than the second base layers; an emitter layer formed along the trench on a surface of the second base layers; a collector layer of the second conductivity type, provided on a second surface of the first base layer opposite to the first surface; an insulating film formed on an inner wall of the trench, the insulating film being thicker on a bottom of the trench than on a side surface of the trench; a gate electrode formed within the trench, and isolated from the second base layers and the emitter layer by the insulating film; and a space section provided between the second base layers adjacent to each other, the space section being deeper than the second base layers and being electrically isolated from the emitter layer and the second base layers.

13 Claims, 25 Drawing Sheets

U.S. PATENT DOCUMENTS

| | | | | |
|---|---|---|---|---|
| 5,304,821 | A * | 4/1994 | Hagino | 257/133 |
| 5,329,142 | A * | 7/1994 | Kitagawa et al. | 257/139 |
| 5,448,083 | A * | 9/1995 | Kitagawa et al. | 257/139 |
| 5,464,994 | A * | 11/1995 | Shinohe et al. | 257/147 |
| 5,471,075 | A * | 11/1995 | Shekar et al. | 257/139 |
| 5,488,236 | A * | 1/1996 | Baliga et al. | 257/132 |
| 5,489,787 | A * | 2/1996 | Amaratunga et al. | 257/137 |
| 5,508,534 | A * | 4/1996 | Nakamura et al. | 257/135 |
| 5,701,026 | A * | 12/1997 | Fujishima et al. | 257/510 |
| 5,801,417 | A * | 9/1998 | Tsang et al. | 257/333 |
| 5,838,026 | A * | 11/1998 | Kitagawa et al. | 257/139 |
| 5,885,878 | A * | 3/1999 | Fujishima et al. | 438/302 |
| 5,915,180 | A | 6/1999 | Hara et al. | |
| 5,977,570 | A * | 11/1999 | Takahashi et al. | 257/136 |
| 6,072,214 | A * | 6/2000 | Herzer et al. | 257/331 |
| 6,153,896 | A | 11/2000 | Omura et al. | |
| 6,211,549 | B1 * | 4/2001 | Funaki et al. | 257/329 |
| 6,221,721 | B1 * | 4/2001 | Takahashi | 438/270 |
| 6,316,807 | B1 * | 11/2001 | Fujishima et al. | 257/333 |
| 6,392,273 | B1 * | 5/2002 | Chang | 257/330 |
| 6,445,012 | B2 * | 9/2002 | Takahashi et al. | 257/136 |
| 6,469,345 | B2 | 10/2002 | Aoki et al. | |
| 6,495,871 | B2 * | 12/2002 | Hattori et al. | 257/279 |
| 6,566,691 | B1 | 5/2003 | Inoue et al. | |
| 6,580,123 | B2 * | 6/2003 | Thapar | 257/330 |
| 6,639,274 | B2 * | 10/2003 | Fujishima | 257/330 |
| 6,656,797 | B2 | 12/2003 | Blanchard | |
| 6,664,163 | B2 * | 12/2003 | Fujishima et al. | 438/270 |
| 6,670,658 | B2 * | 12/2003 | Hattori et al. | 257/279 |
| 6,693,310 | B1 * | 2/2004 | Takahashi et al. | 257/136 |
| 6,747,295 | B2 * | 6/2004 | Inoue et al. | 257/139 |
| 6,777,743 | B2 * | 8/2004 | Hasegawa | 257/329 |
| 6,781,197 | B2 * | 8/2004 | Fujishima et al. | 257/329 |
| 6,809,349 | B2 * | 10/2004 | Yamaguchi et al. | 257/133 |
| 6,815,769 | B2 | 11/2004 | Pfirsch et al. | |
| 6,818,940 | B2 * | 11/2004 | Matsuda | 257/302 |
| 6,867,437 | B2 * | 3/2005 | Takahashi et al. | 257/136 |
| 6,870,200 | B2 * | 3/2005 | Yanagisawa | 257/139 |
| 6,870,220 | B2 * | 3/2005 | Kocon et al. | 257/340 |
| 6,891,223 | B2 * | 5/2005 | Krumrey et al. | 257/139 |
| 6,897,493 | B2 * | 5/2005 | Takahashi et al. | 257/136 |
| 6,906,356 | B1 * | 6/2005 | Chang | 257/130 |
| 7,009,247 | B2 * | 3/2006 | Darwish | 257/330 |
| 7,030,447 | B2 * | 4/2006 | Robb et al. | 257/361 |
| 7,049,186 | B2 * | 5/2006 | Yanagisawa | 438/183 |
| 7,049,657 | B2 * | 5/2006 | Matsuda | 257/333 |
| 7,102,199 | B2 * | 9/2006 | Robb et al. | 257/360 |
| 7,122,860 | B2 * | 10/2006 | Peake et al. | 257/339 |
| 7,227,225 | B2 * | 6/2007 | Ono et al. | 257/331 |
| 7,345,342 | B2 * | 3/2008 | Challa et al. | 257/341 |
| 7,456,487 | B2 | 11/2008 | Ogura et al. | |
| 7,855,415 | B2 * | 12/2010 | Challa et al. | 257/341 |
| 7,859,047 | B2 * | 12/2010 | Kraft et al. | 257/330 |
| 7,902,596 | B2 * | 3/2011 | Kitamura et al. | 257/329 |
| 8,084,812 | B2 * | 12/2011 | Kitamura et al. | 257/329 |
| 8,093,655 | B2 * | 1/2012 | Hirler et al. | 257/341 |
| 2001/0026961 | A1 * | 10/2001 | Williams et al. | 438/142 |
| 2001/0026977 | A1 * | 10/2001 | Hattori et al. | 438/268 |
| 2001/0048132 | A1 * | 12/2001 | Ito et al. | 257/330 |
| 2002/0113263 | A1 * | 8/2002 | Fujishima et al. | 257/330 |
| 2003/0013263 | A1 | 1/2003 | Basceri et al. | |
| 2003/0160270 | A1 * | 8/2003 | Pfirsch et al. | 257/288 |
| 2003/0235959 | A1 | 12/2003 | Lichtenberger et al. | |
| 2004/0041171 | A1 | 3/2004 | Ogura et al. | |
| 2004/0089910 | A1 * | 5/2004 | Hirler et al. | 257/500 |
| 2004/0166636 | A1 * | 8/2004 | Darwish | 438/270 |
| 2004/0178441 | A1 * | 9/2004 | Yanagisawa | 257/327 |
| 2004/0188803 | A1 * | 9/2004 | Matsuda | 257/565 |
| 2005/0167742 | A1 * | 8/2005 | Challa et al. | 257/328 |
| 2005/0173758 | A1 * | 8/2005 | Peake et al. | 257/330 |

FOREIGN PATENT DOCUMENTS

| | | |
|---|---|---|
| JP | 3325424 | 7/2002 |
| JP | 2004-153112 | 5/2004 |

OTHER PUBLICATIONS

Mitsuhiko Kitagawa, et al. "A 4500 V Injection Enhanced Insulated Gate Bipolar Transistor (IEGT) Operating in a Mode Similar to a Thyristor", Proc. IEDM 1993, Dec. 1993, pp. 679-682.

Tomoki Inoue, et al., "New Collector Design Concept for 4.5kV Injection enhanced Gate Transistor (IEGT)", Proc. ISPSD 2002, 2002, pp. 49-52.

Mohamed Darwish, et al., "A New Power W-Grated Trench MOSFET (WMOSFET) With High Switching Performance" ISPSD, Apr. 14-17, 2003, pp. 24-27.

H. Kapels, et al., "Optimized Device Concepts for Reverse Blocking IGBTs", ISPSD, Apr. 14-17, 2003, pp. 148-151.

* cited by examiner

SEMICONDUCTOR DEVICE

CROSS-REFERENCE TO RELATED APPLICATION

The present application is a divisional application of U.S. patent application Ser. No. 12/249,573, filed Oct. 10, 2008, which is a continuation application of U.S. patent application Ser. No. 10/974,810, filed Oct. 28, 2004, which is now U.S. Pat. No. 7,456,487, and is based upon and claims the benefit of priority from the prior Japanese Patent Applications No. 2004-159468, filed on May 28, 2004. The entire contents of the above applications are incorporated herein by reference.

BACKGROUND OF THE INVENTION

1. Field of the Invention

The present invention relates to a semiconductor device.

2. Background Art

In recent years, an IGBT (Insulated Gate Bipolar Transistor) is widely used as a power semiconductor device having a breakdown voltage of 600 V or more. Since the IGBT is normally used as a switch, it is desired to be low in ON resistance and high in switching speed.

The widely used IGBT having a trench structure includes a p-type base and an n-type base vertically adjacent to each other, an n-type emitter provided on a surface of the p-type base, and a p-type collector provided on a rear surface of the n-type base. If a positive bias is applied to a gate electrode with a potential of the emitter set as a reference potential, then an inversion layer is formed on the p-type base, and electrons are injected into the n-type base. As a result, the p-type emitter is positively biased relative to the n-type base, and holes are injected from the p-type collector into the n-type base. As a consequence, the IGBT becomes an ON state.

The holes injected at this time drift in the n-type base and flow into the p-type base. When the holes flow into the p-type base entirely, accumulated holes are reduced and an ON resistance is thereby increased near the p-type base. To solve this disadvantage, an IEGT (Injection Enhanced Bipolar Transistor) is proposed. The IEGT makes use of an IE (Injection Enhancement) effect of increasing a quantity of accumulated holes by disconnecting a part of the p-type base layer to an emitter electrode. An ON resistance of the IEGT can be reduced by the IE effect.

The IGBT and the IEGT is large in capacity $C_{OX}$ generated by a gate oxide film, so that there is a limit to acceleration of a switching speed. In order to turn ON and OFF the IGBT or IEGT, a gate-collector capacity $C_{GC}$ should be charged and discharged during a switching operation. This is because, as the capacity $C_{OX}$ is larger, the gate-collector capacity $C_{GC}$ is larger. Therefore, a frequency of the IGBT or IEGT at a breakdown voltage of, for example, 600 V is limited to about 100 kHz, and that of the IGBT or IEGT at a breakdown voltage of, for example, 4.5 kV is limited to about 500 Hz. It is noted that the IGBT and the IEGT are disclosed in Japanese Patent No. 3325424.

Therefore, a semiconductor device having a low ON resistance and an accelerated switching speed is desired.

SUMMARY OF THE INVENTION

A semiconductor device according to an embodiment of the invention comprises a first base layer of a first conductivity type; a plurality of second base layers of a second conductivity type, provided on a part of a first surface of the first base layer; trenches formed on each side of the second base layers, and formed to be deeper than the second base layers; an emitter layer formed along the trench on a surface of the second base layers; a collector layer of the second conductivity type, provided on a second surface of the first base layer opposite to the first surface; an insulating film formed on an inner wall of the trench, the insulating film being thicker on a bottom of the trench than on a side surface of the trench; a gate electrode formed within the trench, and isolated from the second base layers and the emitter layer by the insulating film; and a space section provided between the second base layers adjacent to each other, the space section being deeper than the second base layers and being electrically isolated from the emitter layer and the second base layers.

A semiconductor device according to another embodiment of the invention comprises a first base layer of a first conductivity type; a plurality of second base layers of a second conductivity type, provided on a part of a first surface of the first base layer; trenches formed on each side of the second base layers, and formed to be deeper than the second base layers; an emitter layer formed along the trench on a surface of the second base layers; a collector layer of the second conductivity type, provided on a second surface of the first base layer opposite to the first surface; an insulating film formed on an inner wall of the trench, the insulating film being formed to be thicker on a sidewall opposite to a second base layer-side sidewall than the insulating film on the second base layer-side sidewall; a gate electrode formed within the trench, and isolated from the second base layers and the emitter layer by the insulating film; and a space section provided between the second base layers adjacent to each other, the space section being deeper than the second base layers and being electrically isolated from the emitter layer and the second base layers.

A semiconductor device according to further embodiment of the invention comprises a first base layer of a first conductivity type; a plurality of second base layers of a second conductivity type, provided on a part of a first surface of the first base layer; trenches formed on each side of the second base layers, and formed to be deeper than the second base layers; an emitter layer formed along the trench on a surface of the second base layers; a collector layer of the second conductivity type, provided on a second surface of the first base layer opposite to the first surface; an insulating film formed on an inner wall of the trench; a gate electrode formed within the trench, and isolated from the second base layers and the emitter layer by the insulating film; a space section provided between the second base layers adjacent to each other, the space section being electrically isolated from the emitter layer and the second base layers; and a bottom semiconductor layer of the second conductivity type, provided on a bottom of the trench, and electrically isolated from the emitter layer and the second base layers.

A semiconductor device according to further embodiment of the invention comprises a first base layer of a first conductivity type; a plurality of second base layers of a second conductivity type, provided on a part of a first surface of the first base layer; trenches formed on each side of the second base layers, and formed to be deeper than the second base layers; an emitter layer formed along the trench on a surface of the second base layers; a collector layer of the second conductivity type, provided on a second surface of the first base layer opposite to the first surface; an insulating film formed on an inner wall of the trench; a gate electrode formed within the trench, and isolated from the second base layers and the emitter layer by the insulating film; a space section provided between the second base layers adjacent to each other, the space section being electrically isolated from the emitter layer and the second base layers; and a bottom semiconductor layer of the first conductivity type, provided on a bottom of the trench, the bottom semiconductor layer being electrically isolated from the emitter layer and the second base layers, and being higher in impurity concentration than the first base layer.

A semiconductor device according to further embodiment of the invention comprises a first base layer of a first conductivity type; a plurality of second base layers of a second conductivity type, provided on a part of a first surface of the first base layer; trenches formed entirely between the second base layers adjacent to each other so as to be wider than the second base layers and to be deeper than the second base layers; an emitter layer formed along the trench on a surface of the second base layers; a collector layer of the second conductivity type, provided on a second surface of the first base layer opposite to the first surface; an insulating film formed on an inner wall of the trench, the insulating film being thicker on the bottom of the trench than on the side surface of the trench; and a space section including a gate electrode formed within the trench, the gate electrode being isolated from the second base layers and the emitter layer by the insulating film.

A semiconductor device according to further embodiment of the invention comprises a first base layer of a first conductivity type; a plurality of second base layers of a second conductivity type, provided on a part of a first surface of the first base layer; trenches formed entirely between the second base layers adjacent to each other so as to be wider than the second base layers and to be deeper than the second base layers; an emitter layer formed along the trench on a surface of the second base layers; a collector layer of the second conductivity type, provided on a second surface of the first base layer opposite to the first surface; an insulating film formed on an inner wall of the trench; a gate electrode formed within the trench, the gate electrode being isolated from the second base layers and the emitter layer by the insulating film; and a bottom semiconductor layer of the second conductivity type, provided on a bottom of the trench, the bottom semiconductor layer being electrically isolated from the emitter layer and the second base layers.

A semiconductor device according to further embodiment of the invention comprises a first base layer of a first conductivity type; a plurality of second base layers of a second conductivity type, provided on a part of a first surface of the first base layer; trenches formed entirely between the second base layers adjacent to each other so as to be wider than the second base layers and to be deeper than the second base layers; an emitter layer formed along the trench on a surface of the second base layer; a collector layer of the second conductivity type, provided on a second surface of the first base layer opposite to the first surface; an insulating film formed on an inner wall of the trench; a gate electrode formed within the trench, the gate electrode being isolated from the second base layers and the emitter layer by the insulating film; and a bottom semiconductor layer of the first conductivity type, provided on a bottom of the trench, the bottom semiconductor layer being electrically isolated from the emitter layer and the second base layers, and being higher in impurity concentration than the first base layer.

A semiconductor device according to further embodiment of the invention comprises a first base layer of a first conductivity type; a plurality of second base layers of a second conductivity type, provided on a part of a first surface of the first base layer; trenches formed on each side of the second base layers, and formed to be deeper than the second base layers; an emitter layer formed along the trench on a surface of the second base layers; a collector layer of the second conductivity type, provided on a second surface of the first base layer opposite to the first surface; an insulating film formed on an inner wall of the trench; a gate electrode formed within the trench, and isolated from the second base layers and the emitter layer by an insulating film; and a space section including a semiconductor layer of the first conductivity type, the semiconductor layer being provided between the second base layers adjacent to each other and being electrically isolated from the emitter layer and the second base layers, the semiconductor layer being higher in impurity concentration than the first base layer.

DETAILED DESCRIPTION OF THE INVENTION

Embodiments of the present invention will be explained below with reference to the drawings. Note that the embodiments do not limit the invention.

(First Embodiment)

Figure 1:
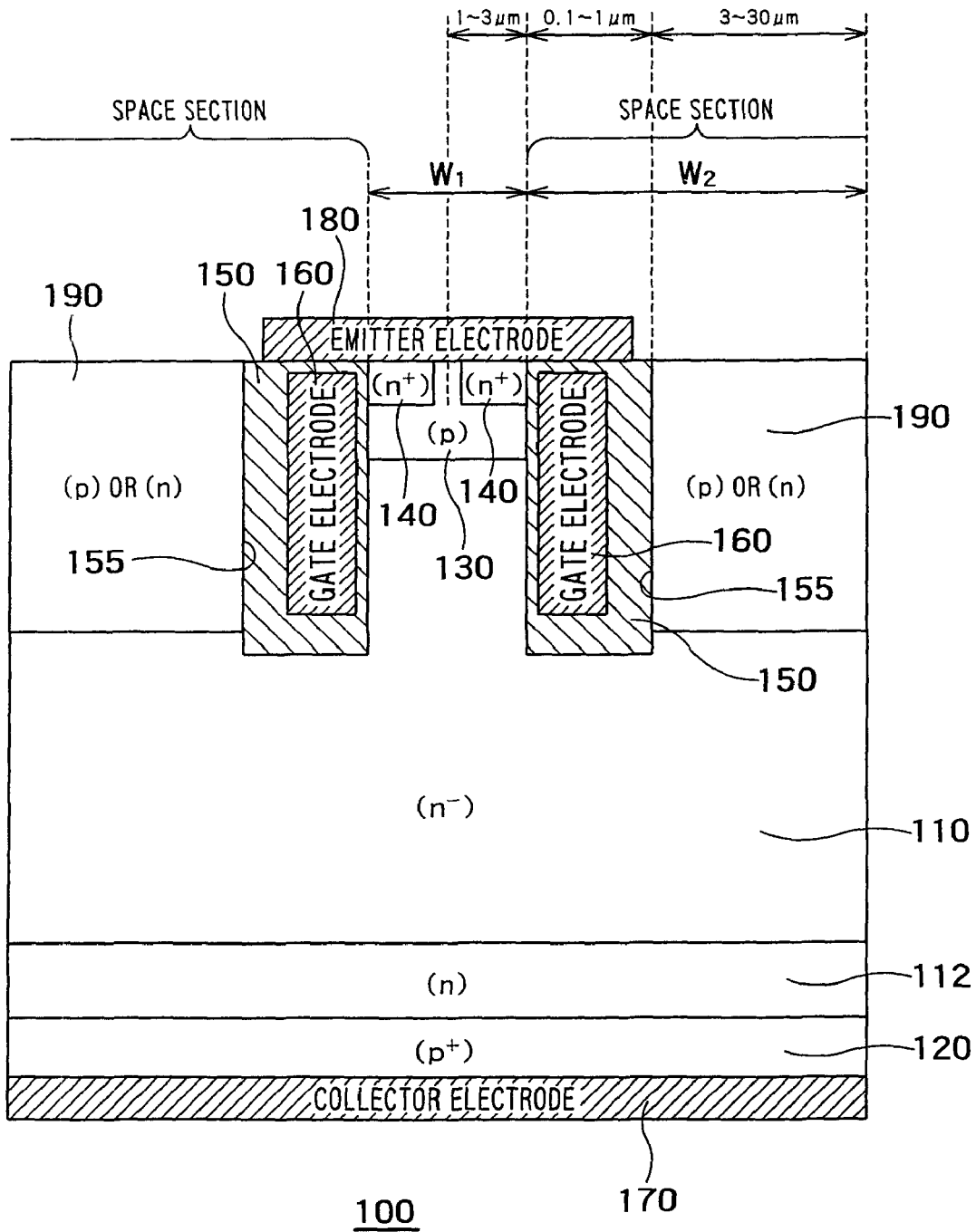
FIG. 1 is a cross-sectional view of a MOS semiconductor device 100 according to a first embodiment of the present invention.

FIG. 1 is a cross-sectional view of a MOS semiconductor device 100 according to a first embodiment of the present invention. The semiconductor device 100 is an IEGT as a power switching element. The semiconductor device 100 includes an n⁻-type first base layer 110, a p-type second base layer 130, an n-type buffer layer 112, trenches 155, an emitter layer 140, a p⁺-type collector layer 120, insulating films 150, gate electrodes 160, and a p-type semiconductor layer 190.

A plurality of base layers 130 are locally provided on a surface of the first base layer 110. In FIG. 1, only one base layer 130 is illustrated. The trenches 155 are formed on both sides of the second base layer 130, respectively, and each trench 155 is formed to be deeper than the second base layer 130. The emitter layers 140 are formed on two surfaces of the second base layer 130, respectively, along outer edges of the trenches 155. The collector layer 120 is formed on a rear surface of the buffer layer 112 opposite to a surface on which the first base layer 110 is formed. The buffer layer 112 is thus provided between the collector layer 120 and the first base layer 110. The insulating film 150 is formed on an inner wall of each trench 155. The gate electrode 160 is formed in each trench 155 and isolated from the second base layer 130 and the emitter layer 140 by the insulating film 150. The semiconductor layer 190 is provided between the adjacent base layers 130 through the trench 155. The semiconductor layer 190 is deeper than the second base layer 130, and electrically isolated from the emitter layer 140 and the second base layer 130. The second base layer 130 and the semiconductor layer 190 are formed locally in a surface region and adjacent to each other so as to put each trench 155 therebetween.

The semiconductor device 100 also includes a collector electrode 170 and an emitter electrode 180. The collector electrode 170 is connected to the collector layer 120. The emitter electrode 180 is connected to the second base layer 130 and the emitter layer 140 but electrically isolated from the semiconductor layer 190.

The first base layer 110, the buffer layer 112, the collector layer 120, the second base layer 130, the emitter layer 140, and the semiconductor layer 190 may be formed of, for example, doped silicon. The insulating film 150 may be formed of, for example, silicon oxide, silicon nitride, or the like. The gate electrode 160 may be formed of, for example, doped poly-silicon.

Figure 2:
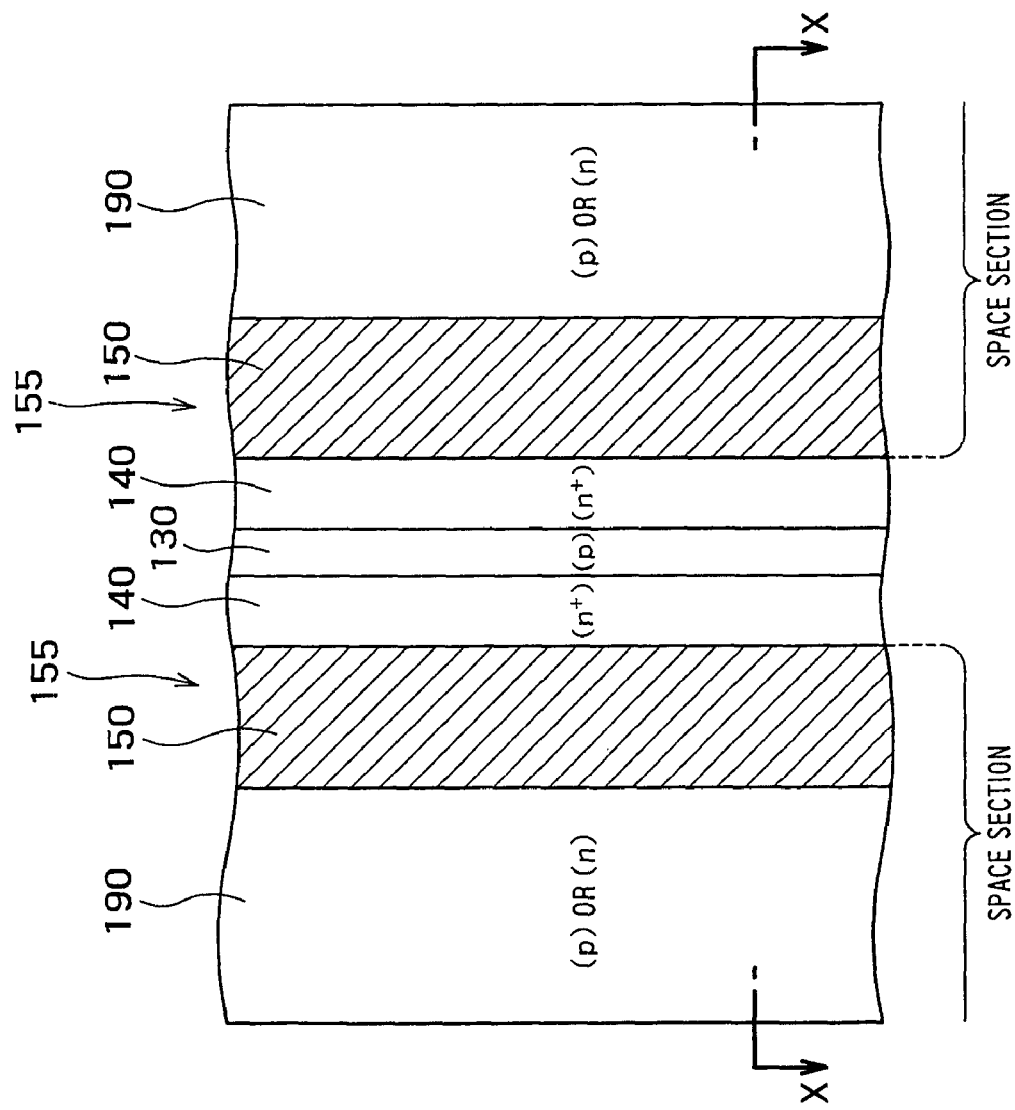
FIG. 2 is a plan view of the semiconductor device 100 according to the first embodiment.

FIG. 2 is a plan view of the semiconductor device 100 according to the first embodiment. This plan view of FIG. 2 shows a structure below the emitter electrode 180. A cross section along a line X-X of FIG. 2 corresponds to the cross section of FIG. 1.

The trenches 155, the emitter layers 140, and the second base layer 130 extend substantially parallel, and are arranged in a direction perpendicular to the extension direction through the semiconductor layers 190. As a result, the trenches 155, the emitter layers 140, and the second base layer 130 are formed into stripes in a plan view. FIG. 2 only shows two trenches 155 as well as the emitter layers 140, the second base layer 130, and the semiconductor layers 190 provided around the respective trenches 155.

When the semiconductor device 100 is in an ON state, the gate electrode 160, the insulating film 150, and the semiconductor layer 190 function as a space section into which no holes flow, as a whole. When the semiconductor device 100 is in the ON state, the second base layer 130 is connected to the emitter electrode 180. Therefore, holes injected from the collector layer 120 drift on the first base layer 110 and then flow into the second base layer 130. On the other hand, no holes flow into the semiconductor layer 190 since the semiconductor layer 190 is not connected to the emitter electrode 180. Therefore, a concentration of excessive carriers is increased in the first base layer 110 and near a bottom of the trench 155 due to the IE effect, thereby increasing injection efficiency. This IE effect further effectively enhanced by narrowing a width of the second base layer 130, i.e., a distance between the trenches 155 at which the second base layer 130 is provided. As shown in FIG. 1, for example, if half a width W1 of the second base layer 130 is 1 to 3 μm, half a width W2 of the space section is a sum of 0.1 to 1 μm and 3 to 30 μm. It is noted that the structure shown in FIG. 1 is repeatedly formed. Therefore, the width W1 of the second base layer 130 is 2 to 6 μm, and the width W2 of the space section is 3 to 30 and several μm. In addition, a depth of the trench 155 is about 3 to 20 μm from the surface. Normally, the deeper the trench 155 is, the greater the IE effect becomes.

Further, the insulating film 150 is formed to be relatively thin between the gate electrode 160 and the second base layer 130 so as to function as a gate insulating film. The insulating film 150 is formed thicker than the gate insulating film between the gate electrode 160 and the semiconductor layer 190 so as to reduce a gate capacity $C_{OX}$. For instance, the second base layer 130-side insulating film 150 (the gate insulating film) is about 500 to 1,000 Å thick and the semiconductor layer 190-side insulating film 150 is about 0.5 to 2 μm thick. The insulating film 150 between a bottom of the gate electrode 160 and that of the trench 155 has a thickness equal to or larger than that of the insulating film between the gate electrode 160 and the semiconductor layer 190. By so constituting, the gate capacity $C_{OX}$ is further reduced.

Since the IGBT or the IEGT has a MOS structure, a switching speed of the semiconductor device 100 is limited according to the gate capacity $C_{OX}$. By making the insulating film 150 between the gate electrode 160 and the semiconductor layer 190 thick, a gate-collector capacity $C_{GC}$ is reduced. Accordingly, the gate capacity $C_{OX}$ is reduced, thereby making it possible to accelerate the switching speed of the semiconductor device 100.

According to the first embodiment, the semiconductor layer 190 is formed to be deeper than the second base layer 130 and to reach near the bottom of the trench 155. As a result, an area of the gate electrode 160 adjacent to the n-type first base layer 110 through the insulating film 150 is made smaller. Therefore, the gate-collector capacity $C_{GC}$ and the gate capacity $C_{OX}$ are further reduced, making it possible to accelerate the switching speed of the semiconductor device 100.

According to the first embodiment, the semiconductor layer 190 reaches near the bottom of the trench 155. Therefore, a depletion layer extends from the bottom of the trench 155 up to a relatively distant position within the first base layer 110. As a result, a breakdown voltage of the semiconductor device 100 is increased.

In the first embodiment, the semiconductor layer 190 may be formed of an n-type semiconductor higher in impurity concentration than the first base layer 110. As a result, the gate-collector capacity $C_{GC}$ can be reduced.

In the present invention, a reduction in gate capacity $C_{OX}$ means a reduction in the gate-collector capacity $C_{GC}$. By reducing the gate-collector capacity $C_{GC}$, the switching speed of the IGBT or the semiconductor device 100 when the IGBT is turned ON or OFF can be accelerated. The basic principle of the acceleration of the switching speed of the IGBT is similar to that of a MOSFET. However, the IGBT greatly differs from the MOSFET in a cooperation relationship between a reduction in ON voltage and the acceleration of the switching speed. Namely, in order to reduce the ON voltage of the MOSFET, it is necessary to reduce a channel length and increase a channel width. As for the IGBT, the ON voltage is lower if the space section is inserted and the channel width is reduced as described in the first embodiment, contrary to the MOSFET. Due to this, as a structure for reducing the ON voltage and accelerating the switching speed of the IGBT, not a structure which is an extension of the conventional MOSFET structure but a completely independent structure is required.

(Second Embodiment)

Figure 3:
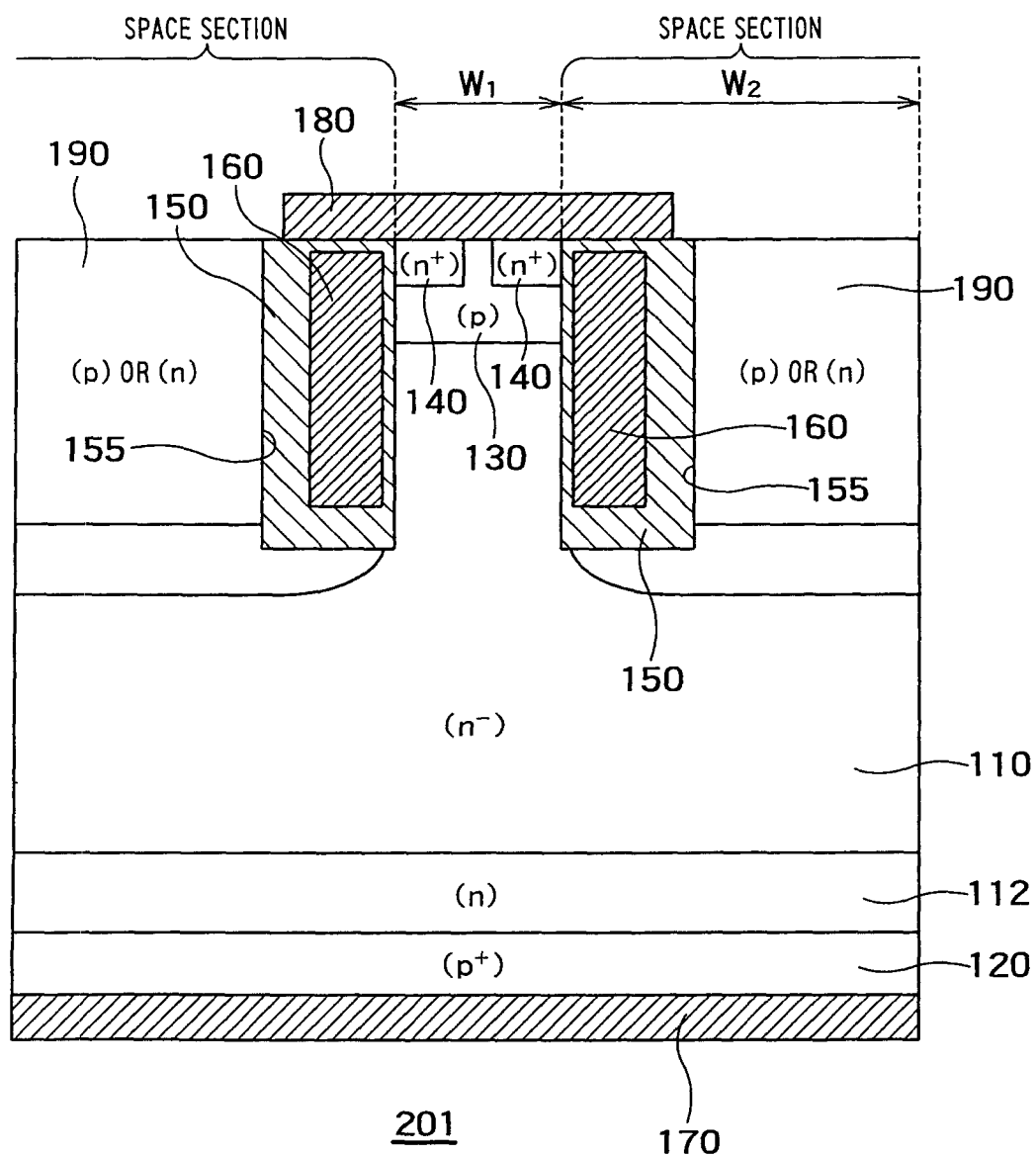
FIG. 3 is a cross-sectional view of a MOS semiconductor device 201 according to a second embodiment of the present invention.

FIG. 3 is a cross-sectional view of a MOS semiconductor device 201 according to a second embodiment of the present invention. The second embodiment differs from the first embodiment in that the semiconductor layer 190 is formed not only on one side surface of the trench 155 but also on a part of the bottom of the trench 155. By so constituting, the area of the gate electrode 160 adjacent to the first base layer 110 through the insulating film 150 is further reduced, and the gate-collector capacity $C_{GC}$ and the gate capacity $C_{OX}$ are further reduced. As a result, the switching speed of the semiconductor device 201 can be more accelerated than the semiconductor device 100. Moreover, the second embodiment exhibits the advantages of the first embodiment.

In the second embodiment, the semiconductor layer 190 may be formed of an n-type semiconductor higher in impurity concentration than the first base layer 110. By this construction, the gate-collector capacity $C_{GC}$ can be reduced.

(Third Embodiment)

Figure 4:
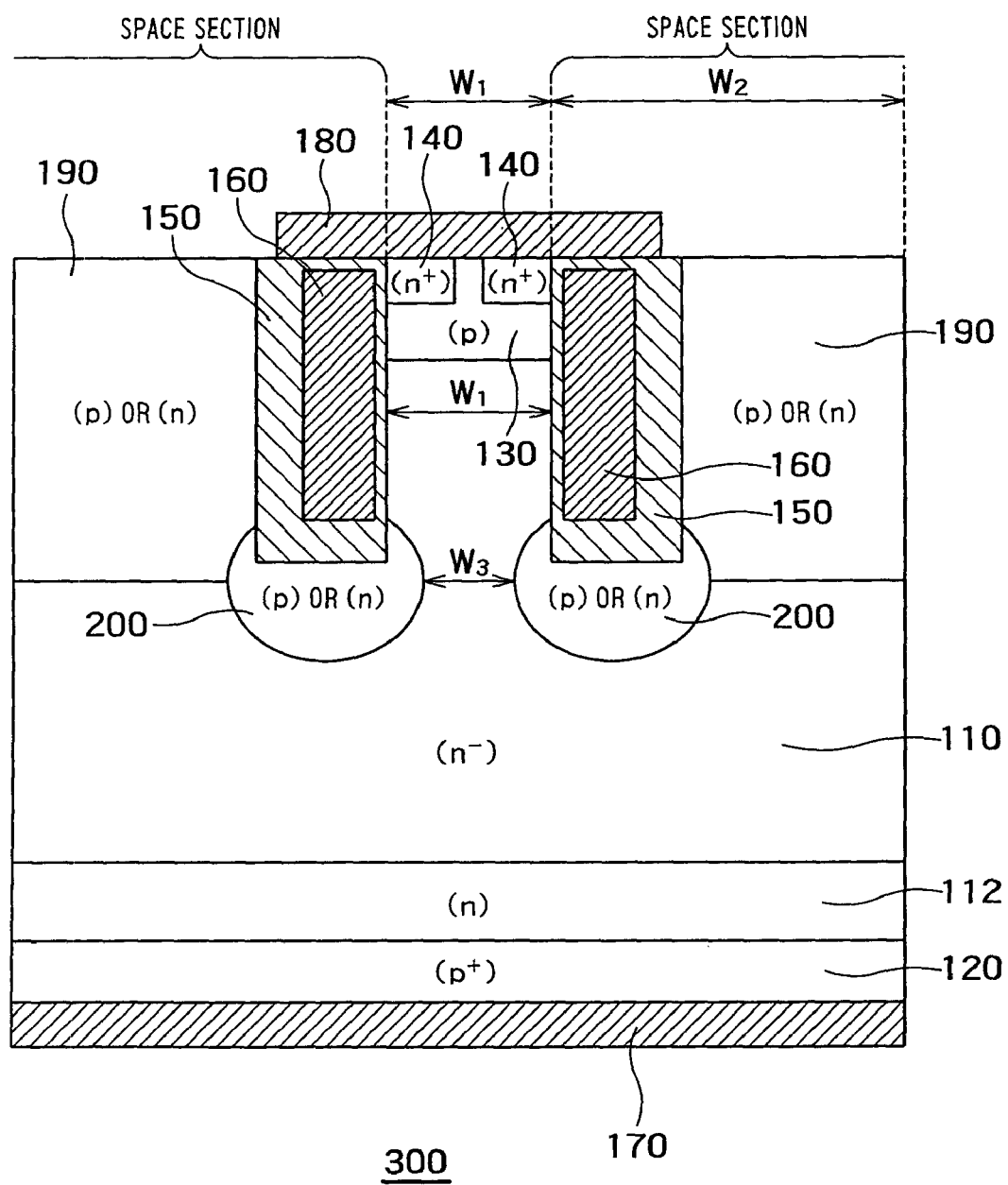
FIG. 4 is a cross-sectional view of a MOS semiconductor device 300 according to a third embodiment of the present invention.

FIG. 4 is a cross-sectional view of a MOS semiconductor device 300 according to a third embodiment of the present invention. The third embodiment differs from the first embodiment by providing a p-type bottom semiconductor layer 200 on a bottom of each trench 155. The bottom semiconductor layer 200 is provided entirely on side surfaces and a bottom of the trench 155. The bottom semiconductor layer 200 is formed by injecting impurities into the bottom of the trench 155 after forming the trench 155.

By forming the bottom semiconductor layer 200, the area of the gate electrode 160 adjacent to the first base layer 110 through the insulating film 150 is further reduced, so that the gate-collector capacity $C_{GC}$ and the gate capacity $C_{OX}$ are further reduced. As a result, a switching speed of the semiconductor device 300 is more accelerated than the semiconductor device 201.

Further, a width W3 between the bottom semiconductor layers 200 provided for the adjacent trenches 155, respectively, is smaller than the width W1 between the trenches 155. Due to this, when the semiconductor device 300 is in an ON state, more holes are accumulated in the first base layer 110 and the second base layer 130. Accordingly, the third embodiment can further be improved in injection efficiency. The third embodiment also exhibits the advantages of the first embodiment.

In the third embodiment, the semiconductor layer 190 and the bottom semiconductor layer 200 may be formed of an n-type semiconductor higher in impurity concentration than the first base layer 110. By the presence of the n-type bottom semiconductor layer 200, the third embodiment has a greater IE effect. Namely, the width W3 between the bottom semiconductor layers 200 provided for the adjacent trenches 155, respectively, is smaller than the width W1 between the trenches 155. Due to this, when the semiconductor device 300 is in an ON state, a concentration of excessive carriers near the bottom of the trenches 155 of the first base layer 110 is higher. As compared with the p-type bottom semiconductor layer 200, an ON voltage can be further reduced. In addition, according to the third embodiment, the n-type bottom semiconductor layer 200 enable to accelerate lateral diffusion of injected electrons and further to reduce the ON voltage.

(Fourth Embodiment)

Figure 5:
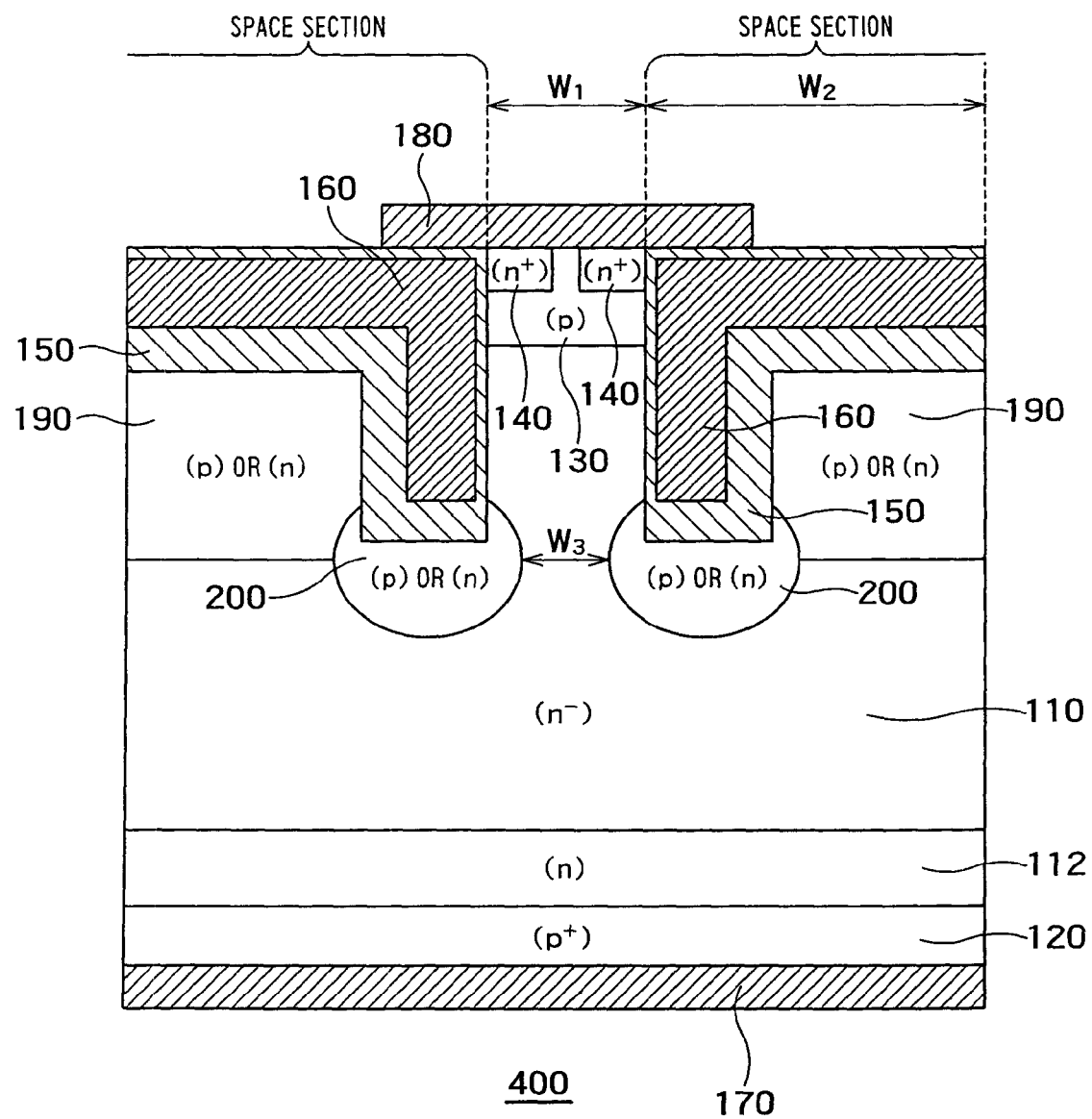
FIG. 5 is a cross-sectional view of a MOS semiconductor device 400 according to a fourth embodiment of the present invention.

FIG. 5 is a cross-sectional view of a MOS semiconductor device 400 according to a fourth embodiment of the present invention. The fourth embodiment differs from the third embodiment by forming the insulating film 150 and the gate electrode 160 on the semiconductor layer 190. The insulating film 150 and the gate electrode 160 may be provided on either the entire surface of the semiconductor layer 190 or a part of the surface of the semiconductor layer 190.

In the fourth embodiment, a resistance of the gate electrode 160 is reduced. Therefore, a switching speed of the semiconductor device 400 can be further accelerated. The fourth embodiment also exhibits the advantages of the third embodiment. The semiconductor layer 190 and the bottom semiconductor layer 200 may be formed as described in the first or second embodiment.

(Fifth Embodiment)

Figure 6:
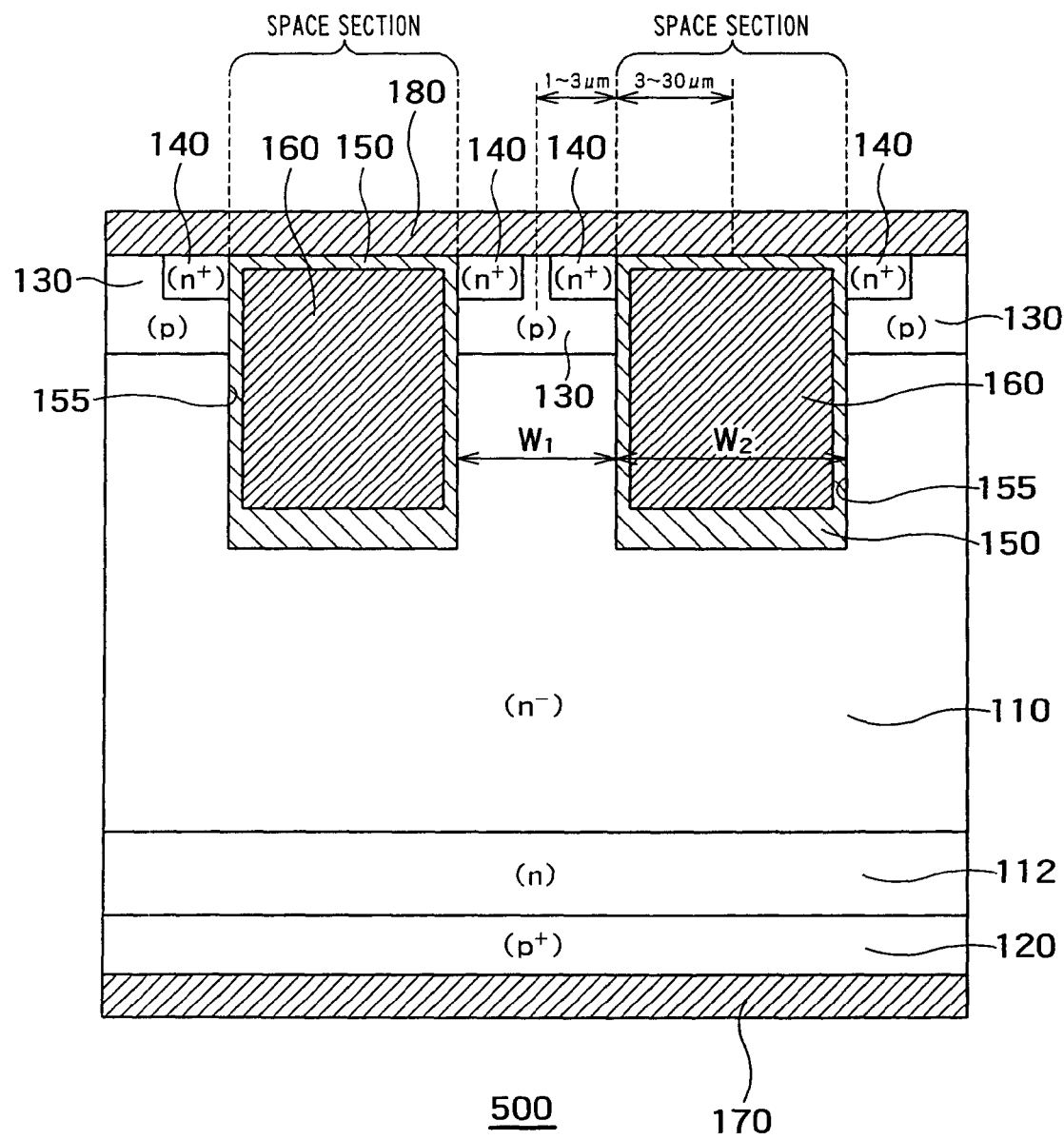
FIG. 6 is a cross-sectional view of a MOS semiconductor device 500 according to a fifth embodiment of the present invention.

FIG. 6 is a cross-sectional view of a MOS semiconductor device 500 according to a fifth embodiment of the present invention. The fifth embodiment differs from the first to the fourth embodiments in that the semiconductor layer 190 and the bottom semiconductor layer 200 are not provided and in that the insulating film 150 and the gate electrode 160 are formed in each entire space section. According to the fifth embodiment, the insulating film 150 and the gate electrode 160 function as the space section into which no holes flow. Therefore, the width W2 of the trench 155 (width of the insulating film 150 or the gate electrode 160) corresponds to that of the space section.

The fifth embodiment exhibits the same advantages as those of the first embodiment. Furthermore, since it is unnecessary to form the semiconductor layer 190 and the bottom semiconductor layer 200, the semiconductor device 500 of the fifth embodiment can be manufactured easily, as compared with the first to the fourth embodiments.

(Sixth Embodiment)

Figure 7:
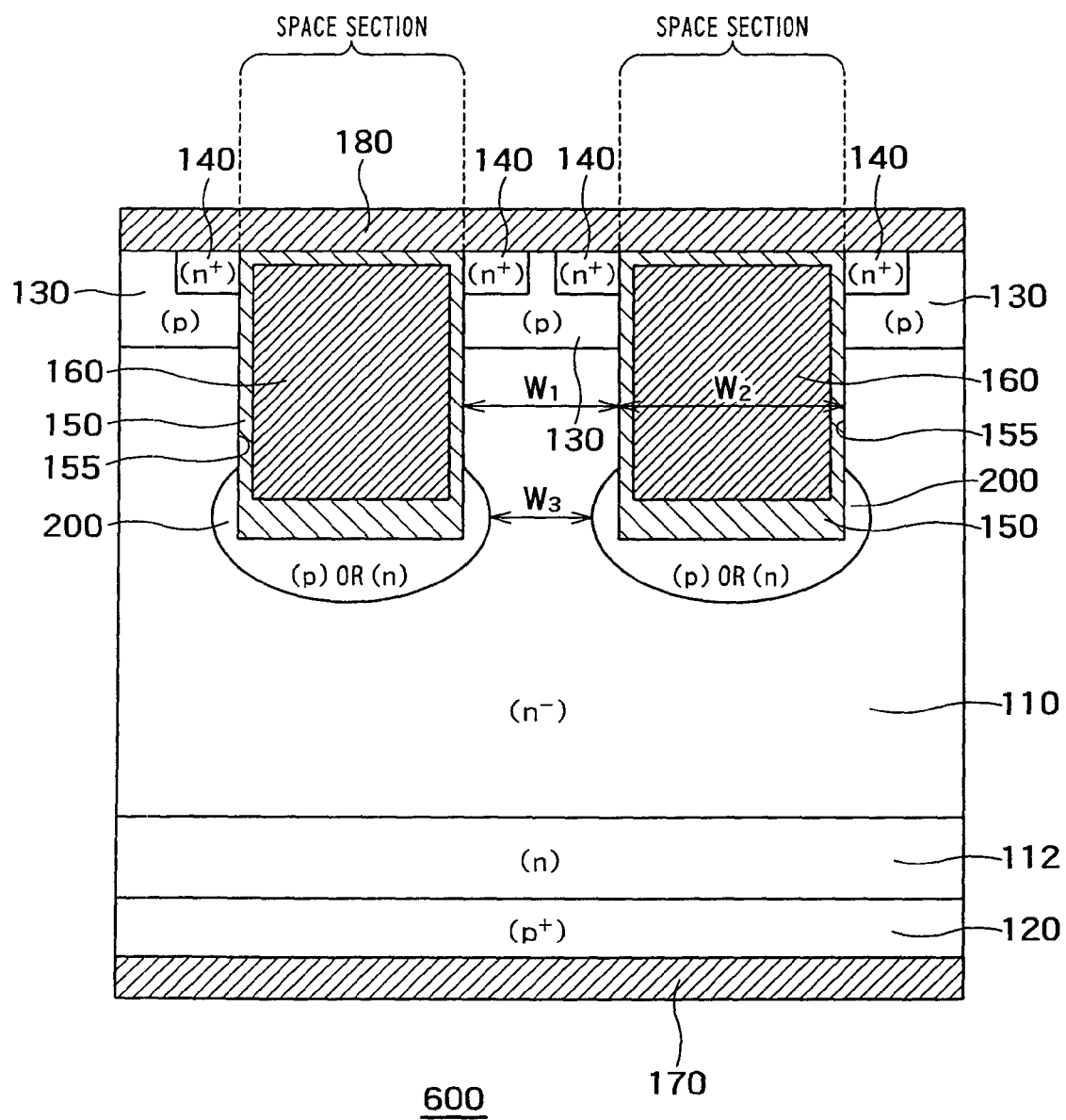
FIG. 7 is a cross-sectional view of a MOS semiconductor device 600 according to a sixth embodiment of the present invention.

FIG. 7 is a cross-sectional view of a MOS semiconductor device 600 according to a sixth embodiment of the present invention. The sixth embodiment differs from the fifth embodiment by providing the bottom semiconductor layer 200 on the bottom of each trench 155. The bottom semiconductor layer 200 exhibits the same advantages as those of the bottom semiconductor layer 200 according to the third embodiment. Therefore, a switching speed of the semiconductor device 600 according to the sixth embodiment can be further accelerated, as compared with the fifth embodiment. In addition, injection efficiency can be further improved, as compared with the fifth embodiment.

In the sixth embodiment, the bottom semiconductor layer 200 may be formed of an n-type semiconductor higher in impurity concentration than the first base layer 110. By so forming, the IE effect can be improved.

(Seventh Embodiment)

Figure 8:
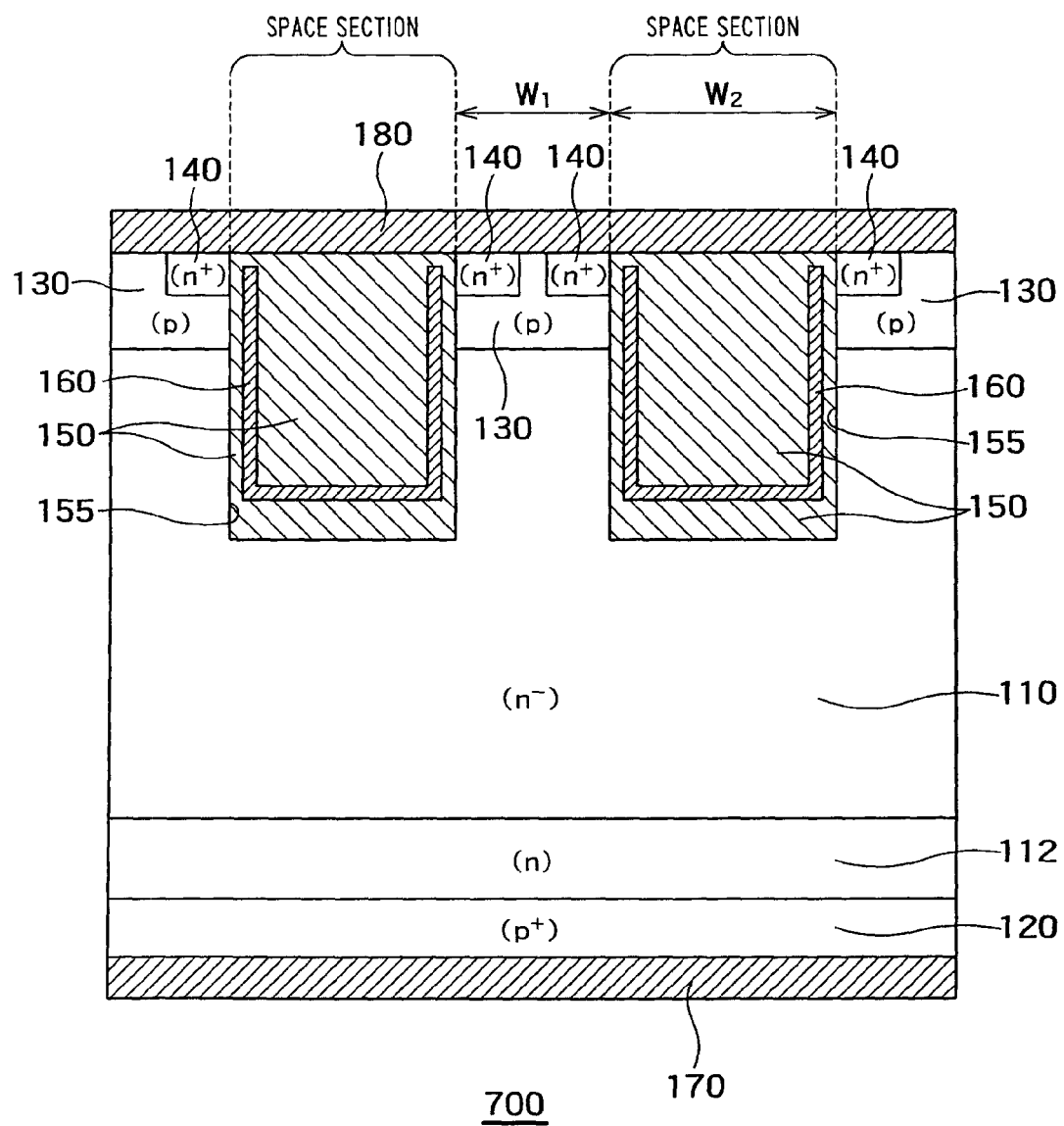
FIG. 8 is a cross-sectional view of a MOS semiconductor device 700 according to a seventh embodiment of the present invention.

FIG. 8 is a cross-sectional view of a MOS semiconductor device 700 according to a seventh embodiment of the present invention. According to the seventh embodiment, the gate electrode 160 is provided within each trench 155 through the insulating film 150, and the insulating film 150 is further filled into inside of the gate electrode 160. The other constituent elements of the semiconductor device 700 according to the seventh embodiment may be same as those of the semiconductor device 600 according to the sixth embodiment.

In the seventh embodiment, an interior of the trench 155 is manufactured as follows. The insulating film 150 and a gate electrode material are sequentially deposited on an inner wall of the trench 155. At this time, the gate electrode material is deposited by a film thickness sufficient to cover sidewalls of the trench 155 without entirely filling the gate electrode material into the trench 155. Further, the insulating film 150 is deposited on this gate electrode material, thereby filling the trench 155 with the gate electrode material and the insulating film material. The seventh embodiment exhibits the same advantages as those of the fifth embodiment.

(Eighth Embodiment)

Figure 9:
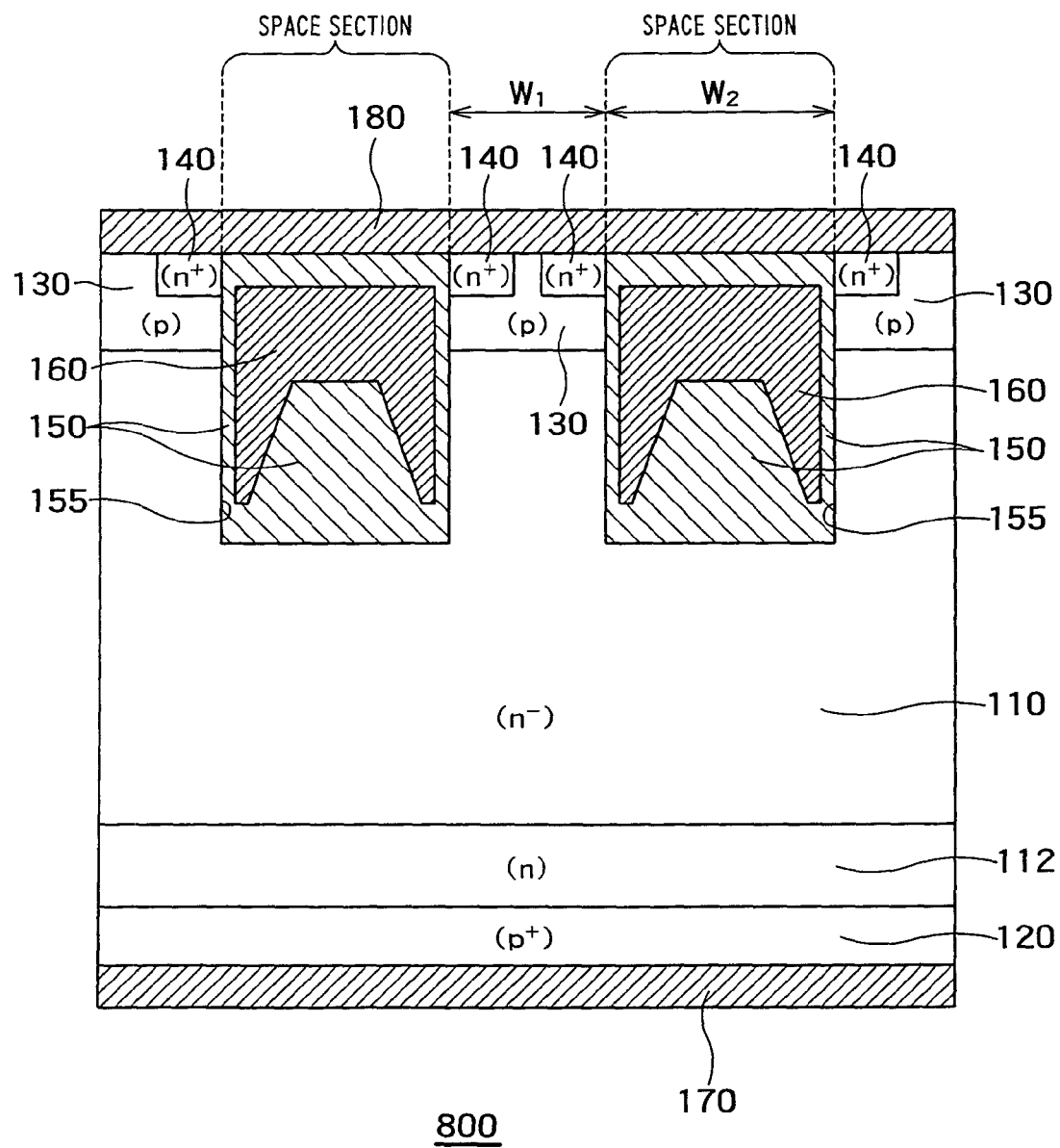
FIG. 9 is a cross-sectional view of a MOS semiconductor device 800 according to an eighth embodiment of the present invention.

FIG. 9 is a cross-sectional view of a MOS semiconductor device 800 according to an eighth embodiment of the present invention. In the eighth embodiment, the gate electrode 160 is filled into an upper portion of each trench 155 through the insulating film 150, and the insulating film 150 is filled into inside of the gate electrode 160 in a lower portion of the trench 155. The insulating film 150 filled into inside of the gate electrode 160 has a forward tapered shape. The other constituent elements of the semiconductor device 800 according to the eighth embodiment may be same as those of the semiconductor device 700 according to the seventh embodiment.

In the eighth embodiment, the interior of the trench 155 is manufactured by, for example, a well-known LOCOS method as follows. A nitride film $Si_3N_4$ is first formed on the inner wall of the trench 155, and only the nitride film $Si_3N_4$ on the bottom of the trench 155 is removed by isotropic etching such as RIE. Thereafter, oxidization is performed to oxidize only the bottom of the trench 155, thereby forming a thick oxide film only on the bottom of the trench 155. The nitride film $Si_3N_4$ is removed, and a gate oxide film is formed on sidewalls of the trench 155. Thereafter, the gate electrode material is deposited on the upper portion of the trench 155. The thick oxide film formed by the LOCOS method is forward tapered as shown in FIG. 9. This facilitates filling the gate electrode material.

The eighth embodiment exhibits the same advantages as those of the seventh embodiment. In addition, according to the eighth embodiment, the gate electrode 160 is not present on the bottom of each trench 155 differently from the seventh embodiment. Therefore, the gate-collector capacity $C_{GC}$ is further reduced. As a result, a switching speed of the semiconductor device 800 according to the eighth embodiment can be further accelerated.

(Ninth Embodiment)

Figure 10:
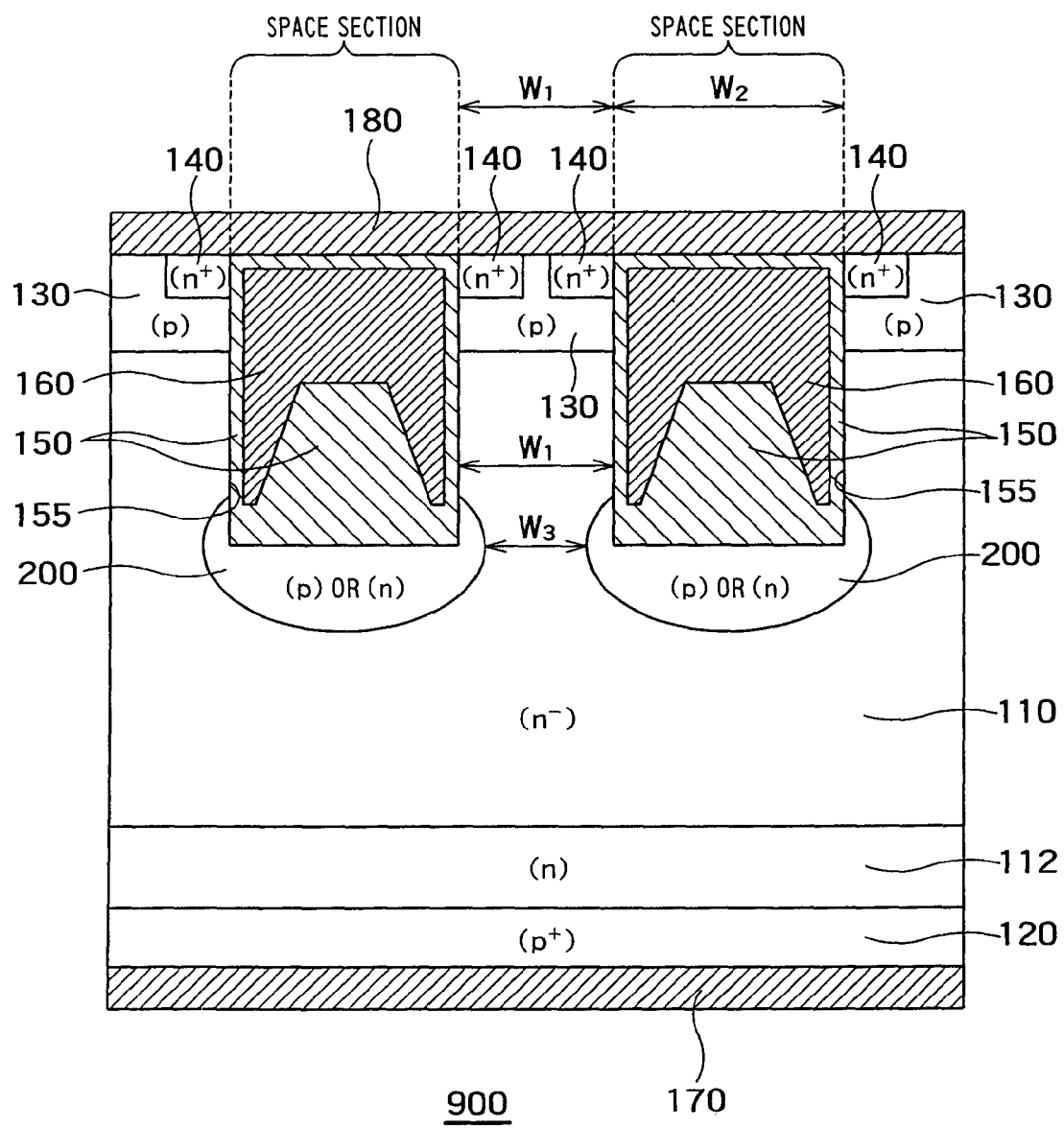
FIG. 10 is a cross-sectional view of a MOS semiconductor device 900 according to a ninth embodiment of the present invention.

FIG. 10 is a cross-sectional view of a MOS semiconductor device 900 according to a ninth embodiment of the present invention. The ninth embodiment differs from the eighth embodiment by forming an n- or a p-type bottom semiconductor layer 200 entirely on the bottom of each trench 155. The other constituent elements of the semiconductor device 900 according to the ninth embodiment may be same as those of the semiconductor device 800 according to the eighth embodiment.

By so constituting, the area of the gate electrode 160 adjacent to the first base layer 110 through the insulating film 150 is further reduced. Therefore, the gate-collector capacity $C_{GC}$ and the gate capacity $C_{OX}$ can be further reduced. As a result, a switching speed of the semiconductor device 900 can be further accelerated, as compared with the semiconductor device 201 according to the second embodiment.

Moreover, according to the ninth embodiment, similarly to the third embodiment, when the semiconductor device 900 is in an ON state, more holes are accumulated in the first base layer 110 and the second base layer 130. Therefore, the injection efficiency can be further improved according to the ninth embodiment.

In the ninth embodiment, the bottom semiconductor layer 200 may be formed of an n-type semiconductor higher in impurity concentration than the first base layer 110. By so forming, the IE effect can be further improved.

(Tenth Embodiment)

Figure 11:
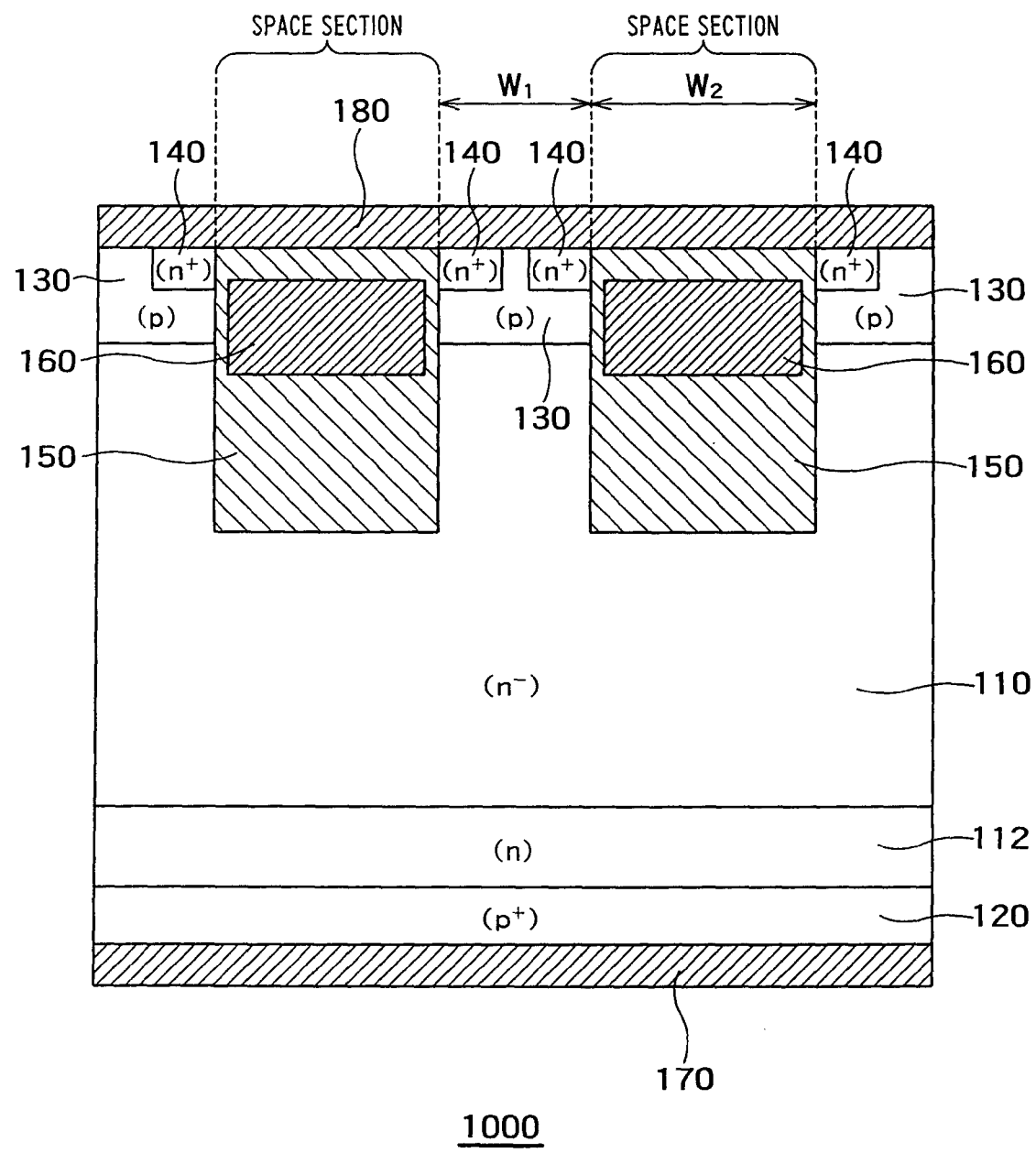
FIG. 11 is a cross-sectional view of a MOS semiconductor device 1000 according to a tenth embodiment of the present invention.

FIG. 11 is a cross-sectional view of a MOS semiconductor device 1000 according to a tenth embodiment of the present invention. In the tenth embodiment, the gate electrode 160 is filled into an upper portion of each trench 155 through the insulating film 150, and the insulating film 150 is filled into a lower portion of the trench 155. The other constituent elements of the semiconductor device 1000 according to tenth embodiment may be same as those of the semiconductor device 800 according to the eighth embodiment.

In the tenth embodiment, the interior of the trench 155 is manufactured as follows. The insulating film 150 is filled into the trench 155, and etched back to be deeper than the second base layer 130. The insulating film 150 is deposited on inner walls of the trench 155, and a gate electrode material is filled into the insulating film 150.

The tenth embodiment exhibits the same advantages as those of the eighth embodiment. In addition, according to the tenth embodiment, differently from the eighth embodiment, the gate electrode 160 is formed only in the upper portion of the trench 155. Therefore, the gate-collector capacity $C_{GC}$ is further reduced. As a result, a switching speed of the semiconductor device 1000 according to the tenth embodiment can be further accelerated.

(Eleventh Embodiment)

Figure 12:
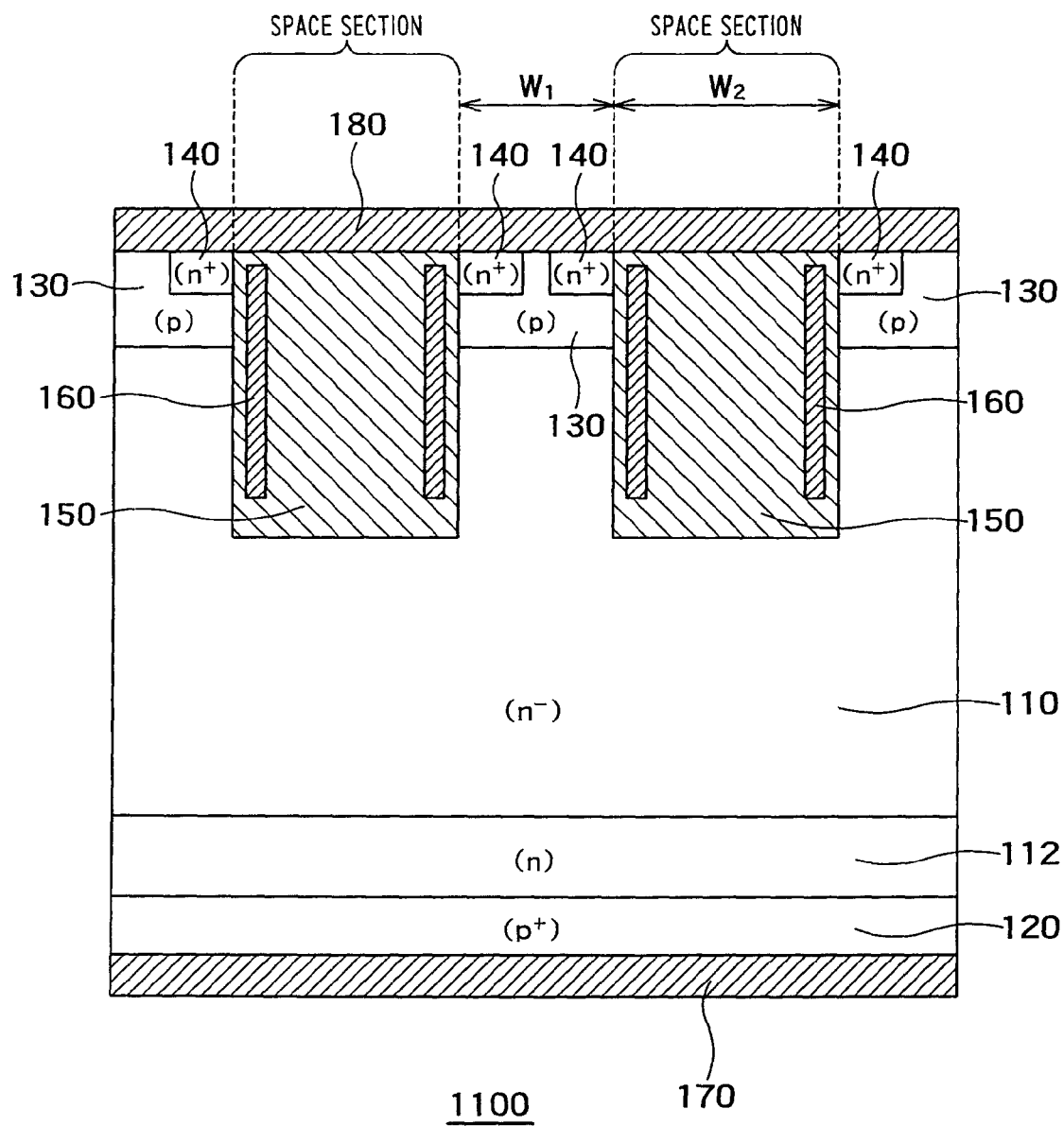
FIG. 12 is a cross-sectional view of a MOS semiconductor device 1100 according to an eleventh embodiment of the present invention.

FIG. 12 is a cross-sectional view of a MOS semiconductor device 1100 according to an eleventh embodiment of the present invention. In the eleventh embodiment, an insulating film 150 and gate electrodes 160 are formed along sidewalls of each trench 155, and the insulating film 150 is filled between the gate electrodes 160. The other constituent elements of the semiconductor device 1100 according to the eleventh embodiment may be same as those of the semiconductor device 900 according to the ninth embodiment.

In the eleventh embodiment, the interior of the trench 155 is manufactured as follows. The insulating film 150 and a gate electrode material are sequentially deposited on an interior of the trench 155. At this time, the gate electrode material is deposited by a film thickness sufficient to cover the sidewalls of the trench 155 without entirely filling the gate electrode material into the trench 155. The gate electrode material is then anisotropically etched, thereby removing the gate electrode material on the bottom of the trench 155. Further, the insulating film 150 is filled into the trench 155. The eleventh embodiment exhibits the same advantages as those of the ninth embodiment.

(Twelfth Embodiment)

Figure 13:
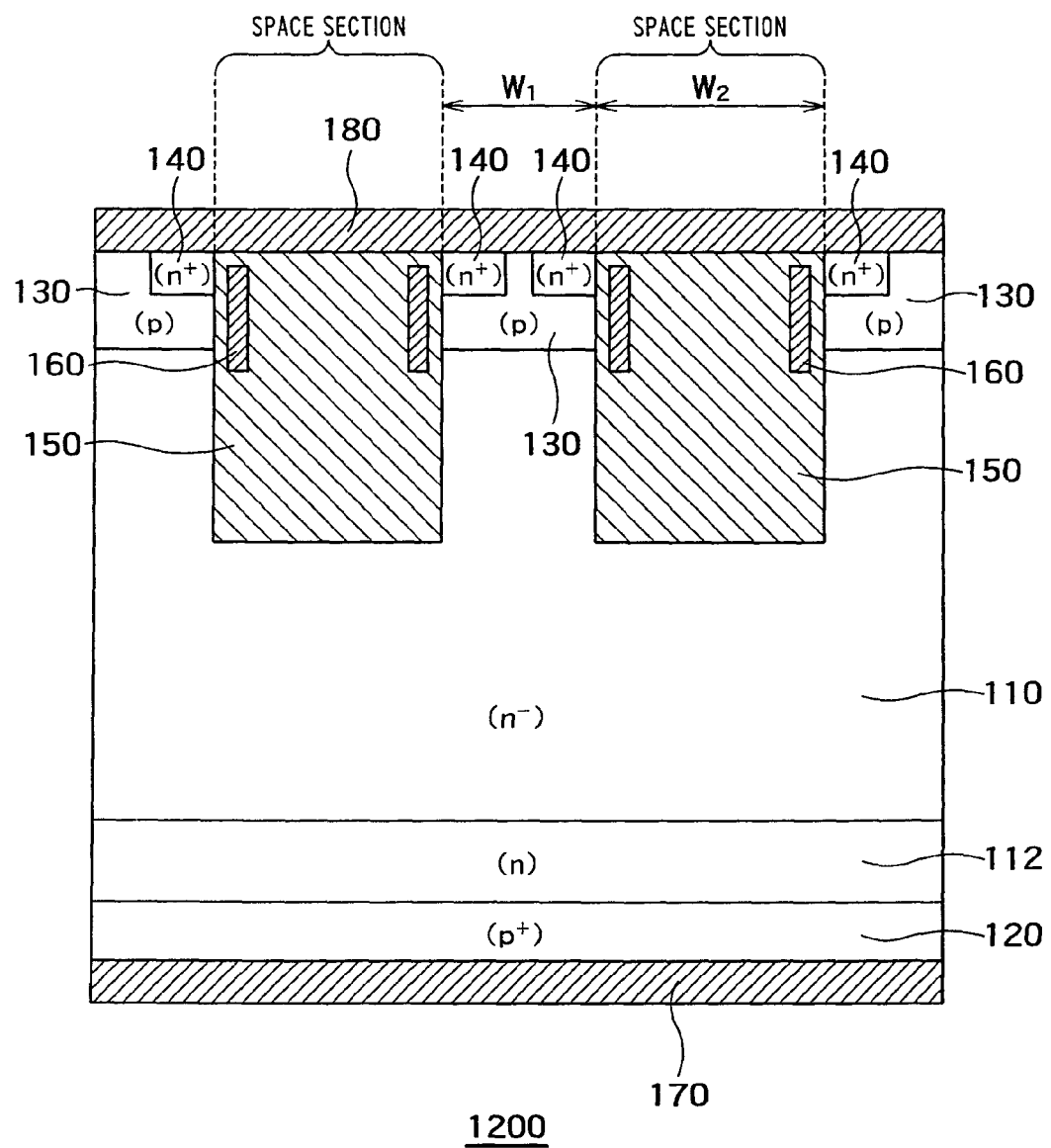
FIG. 13 is a cross-sectional view of a MOS semiconductor device 1200 according to a twelfth embodiment of the present invention.

FIG. 13 is a cross-sectional view of a MOS semiconductor device 1200 according to a twelfth embodiment of the present invention. In the twelfth embodiment, gate electrodes 160 are formed along sidewalls of the trench 155, respectively, only in the upper portion of each trench 155. The other constituent elements of the semiconductor device 1200 according to the twelfth embodiment may be same as those of the semiconductor device 1100 according to the eleventh embodiment.

In the twelfth embodiment, the interior of the trench 155 is manufactured as follows. The insulating film 150 is filled into the trench 155, and etched back to be deeper than the second base layer 130. The insulating film 150 and the gate electrode material are deposited on the inner wall of the trench 155, and the insulating film 150 is further filled between the gate electrode materials.

The twelfth embodiment exhibits the same advantages as those of the eleventh embodiment. Further, according to the twelfth embodiment, differently from the eleventh embodiment, since the gate electrode 160 is formed only in the upper portion of the trench 155, the gate-collector capacity $C_{GC}$ is further reduced. As a result, a switching speed of the semiconductor device 1200 according to the twelfth embodiment can be further accelerated.

(Thirteenth Embodiment)

Figure 14:
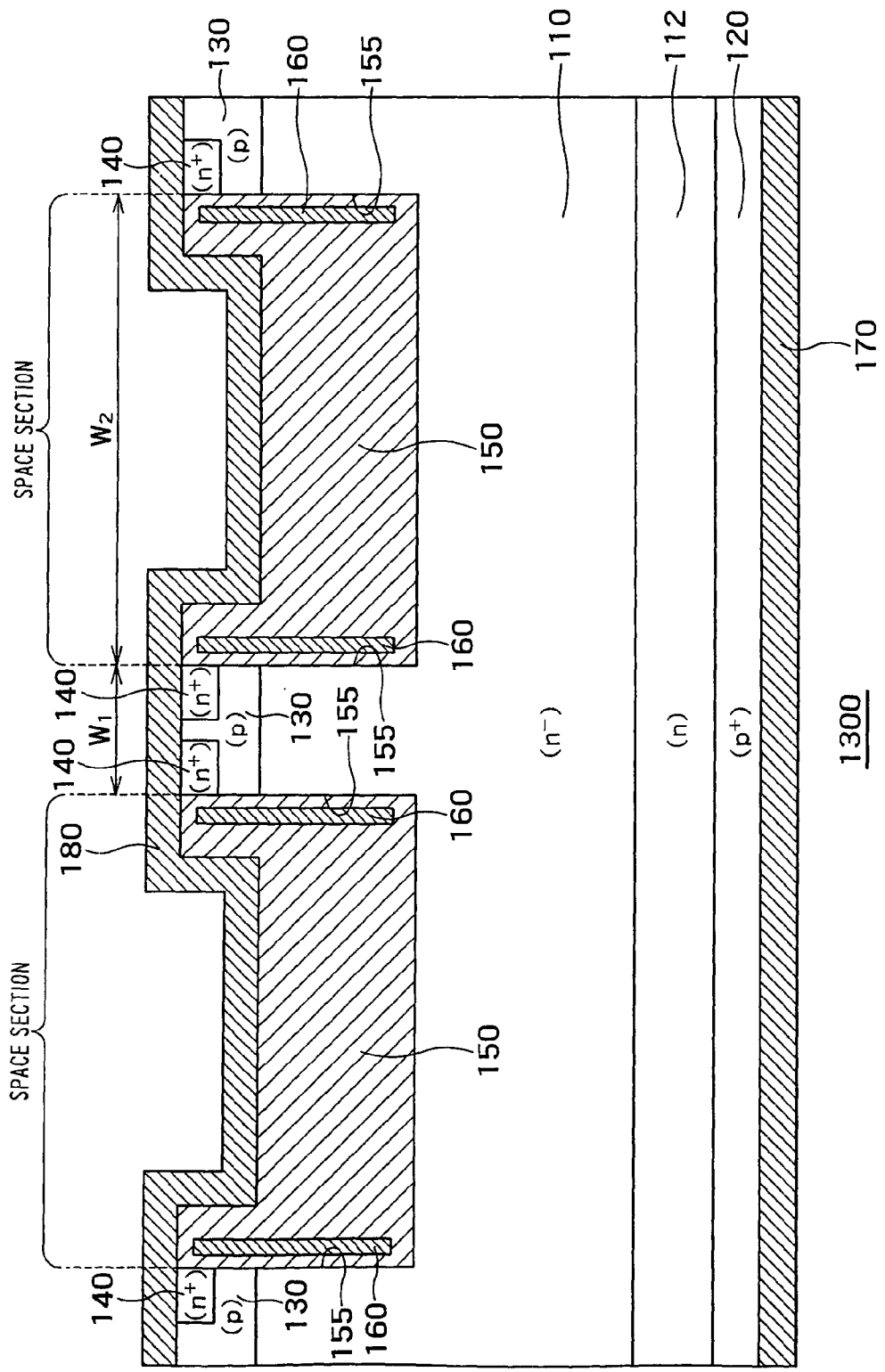
FIG. 14 is a cross-sectional view of a MOS semiconductor device 1300 according to a thirteenth embodiment of the present invention.

FIG. 14 is a cross-sectional view of a MOS semiconductor device 1300 according to a thirteenth embodiment of the present invention. In the thirteenth embodiment, gate electrodes 160 are formed along sidewalls of each trench 155, respectively, through the insulating film 150, and the emitter electrode 180 is formed between the gate electrodes 160 through the insulating film 150. The other constituent elements of the semiconductor device 1300 according to the thirteenth embodiment may be same as those of the semiconductor device 1100 according to the eleventh embodiment.

In the thirteenth embodiment, the interior of the trench 155 is manufactured as follows. The insulating film 150 and the gate electrode material are sequentially deposited within the trench 155. At this time, the gate electrode material is deposited by a film thickness sufficient to cover the sidewalls of the trench 155 without entirely filling the gate electrode material into the trench 155. The gate electrode material is then anisotropically etched, thereby removing the gate electrode material on the bottom of the trench 155. Further, the insulating film 150 and an emitter electrode material are deposited within the trench 155.

The thirteenth embodiment exhibits the same advantages as those of the eleventh embodiment. Further, in the thirteenth embodiment, since the emitter electrode 180 is also formed within the trench 155, a resistance of the emitter electrode 180 is reduced. A switching speed of the semiconductor device 1300 can be, thereby, further accelerated.

(Fourteenth Embodiment)

Figure 15:
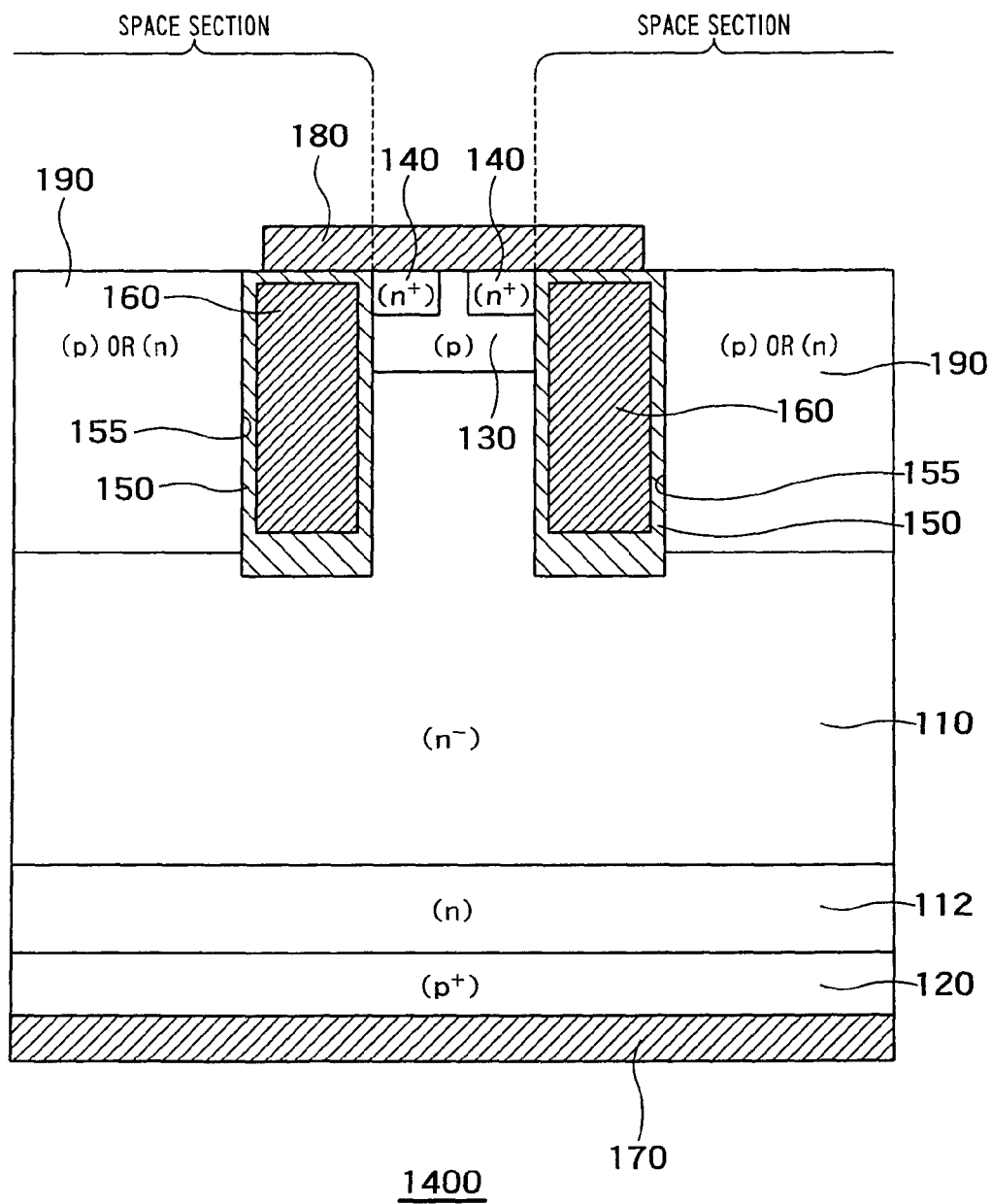
FIG. 15 is a cross-sectional view of a MOS semiconductor device 1400 according to a fourteenth embodiment of the present invention.

FIG. 15 is a cross-sectional view of a MOS semiconductor device 1400 according to a fourteenth embodiment of the present invention. In the fourteenth embodiment, the insulating film 150 is formed to be relatively thicker on the bottom of each trench 155, and to be as thick as the gate insulating film on each side surface of the trench 155. The other constituent elements of the semiconductor device 1400 according to the fourteenth embodiment may be same as those of the semiconductor device 100 according to the first embodiment.

The insulating film 150 is as thick as the gate insulating film between the gate electrode 160 and the semiconductor layer 190. Therefore, the semiconductor device 1400 according to the fourteenth embodiment can be manufactured more easily than the semiconductor device 100 according to the first embodiment. Further, since the semiconductor layer 190 is formed to be deep, the fourteenth embodiment exhibits the same advantages as those of the first embodiment.

In the fourteenth embodiment, the semiconductor layer 190 may be formed of an n-type semiconductor higher in impurity concentration than the first base layer 110. By so forming, the gate-collector capacity $C_{GC}$ can be reduced.

(Fifteenth Embodiment)

Figure 16:
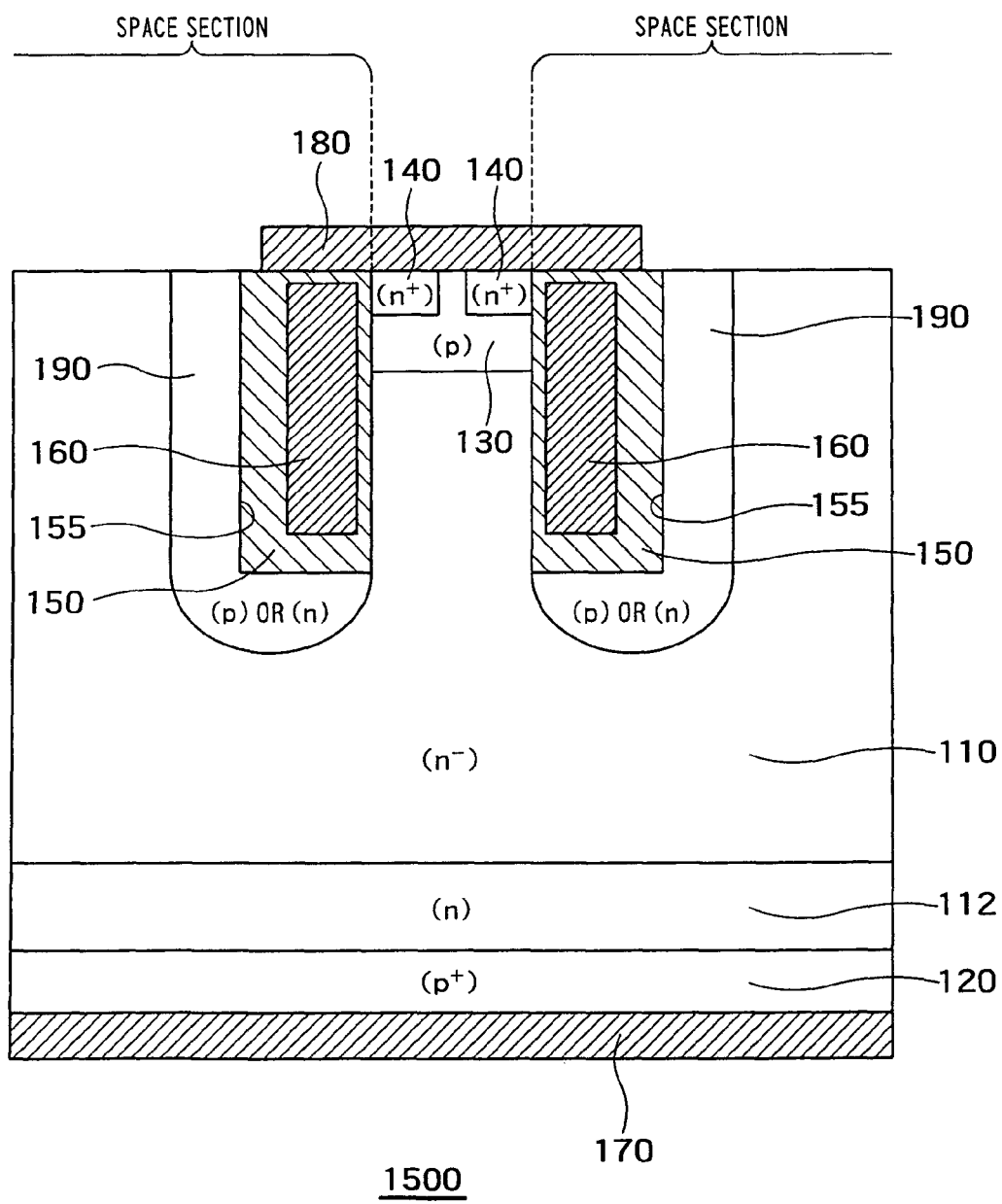
FIG. 16 is a cross-sectional view of a MOS semiconductor device 1500 according to a fifteenth embodiment of the present invention.

FIG. 16 is a cross-sectional view of a MOS semiconductor device 1500 according to a fifteenth embodiment of the present invention. The fifteenth embodiment differs from the second embodiment by forming the semiconductor layer 190 in a part of a region of the space section. The other constituent elements of the semiconductor device 1500 may be same as those of the semiconductor device 200 according to the second embodiment.

The semiconductor layer 190 according to the fifteenth embodiment is manufactured as follows. After forming each trench 155, impurities are injected aslant into a space section-side bottom and side surfaces of the trench 155. Thereafter, the impurities injected into the bottom and side surfaces of the trench 155 are diffused, thereby forming the semiconductor layer 190.

Although the semiconductor layer 190 is not formed entirely in the space section, the semiconductor layer 190 is formed entirely on the bottom surface and one side surface of the trench 155. Therefore, according to the fifteenth embodiment, similarly to the second embodiment, the collector-gate capacity $C_{GC}$ can be reduced. The insulating film 150 may be thicker than the gate insulating film only on the bottom of the trench 155 and may be as thick as the gate insulating film on the side surface of the trench 155.

In the fifteenth embodiment, the semiconductor layer 190 may be formed of an n-type semiconductor higher in impurity concentration than the first base layer 110. By so forming, the gate-collector capacity $C_{GC}$ can be reduced.

Sixteenth Embodiment

Figure 17:
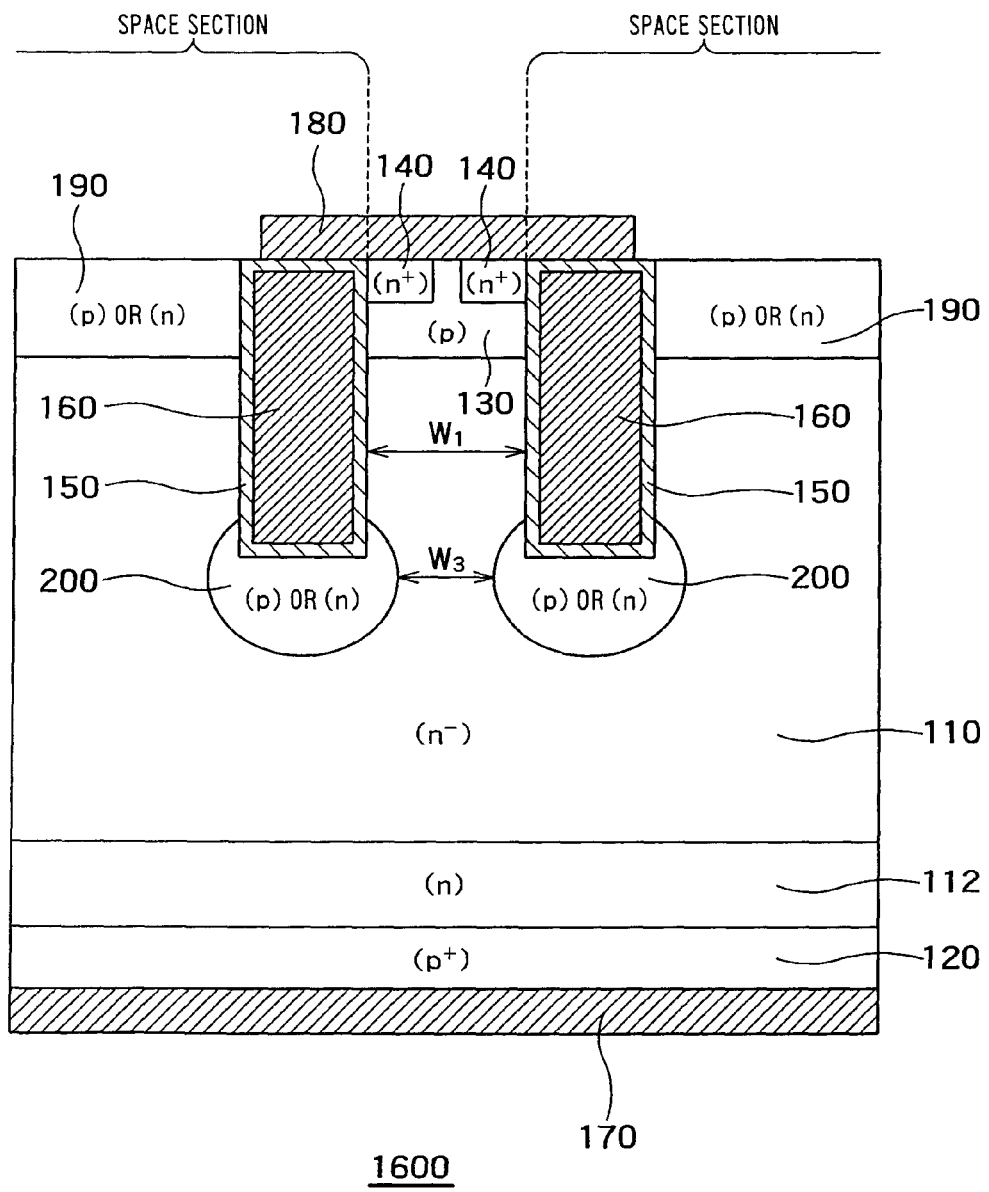
FIG. 17 is a cross-sectional view of a MOS semiconductor device 1600 according to a sixteenth embodiment of the present invention.

FIG. 17 is a cross-sectional view of a MOS semiconductor device 1600 according to a sixteenth embodiment of the present invention. In the sixteenth embodiment, the insulating film 150 is deposited on the inner wall of each trench 155 by a substantially equal film thickness (a thickness of the gate insulating film). The semiconductor layer 190 is substantially equal in depth to the second base layer 130. The p- or n-type bottom semiconductor layer 200 is formed on the bottom of each trench 155. The other constituent elements of the semiconductor device 1600 according to the sixteenth embodiment may be same as those of the semiconductor device 300 according to the third embodiment.

According to the sixteenth embodiment, since the bottom semiconductor layer 200 is provided, the gate-collector capacity $C_{GC}$ can be reduced as compared with the conventional semiconductor device. In addition, since the width W3 between the bottom semiconductor layers 200 is smaller than the width W1 between the trenches 155, the hole injection efficiency can be improved similarly to the third embodiment. Further, the semiconductor layer 190 may be formed of an n-type semiconductor higher in impurity concentration than the first base layer 110. By so forming, the gate-collector capacity $C_{GC}$ can be reduced. Since the bottom semiconductor layer 200 is the n-type semiconductor, the IE effect can be further improved, thereby further reducing the ON voltage.

The insulating film 150 may be thicker than the gate insulating film on the bottom of the trench 155. The insulating film 150 may be thicker than the gate insulating film on the space section-side side surface of the trench 155.

(Seventeenth Embodiment)

Figure 18:
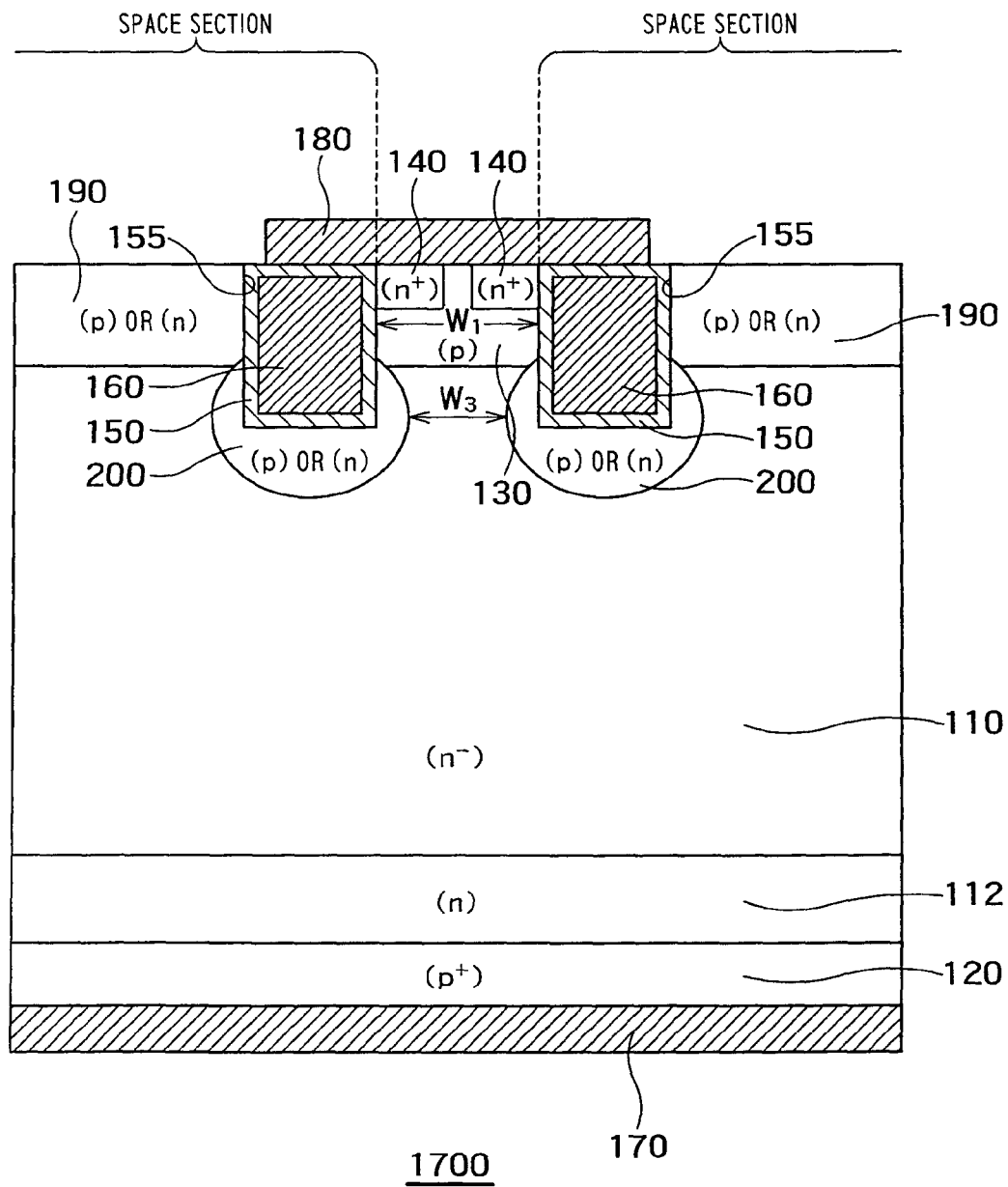
FIG. 18 is a cross-sectional view of a MOS semiconductor device 1700 according to a seventeenth embodiment of the present invention.

FIG. 18 is a cross-sectional view of a MOS semiconductor device 1700 according to a seventeenth embodiment of the present invention. In the seventeenth embodiment, each trench 155 is formed to be relatively shallow, and the gate electrode 160 is formed to be short, accordingly. It is noted, however, that it is necessary to form the gate electrode 160 up to a deeper position than the second base layer 130 so that the semiconductor device 1700 performs a switching operation. The other constituent elements of the semiconductor device 1700 according to the seventeenth embodiment may be same as those of the semiconductor device 1600 according to the sixteenth embodiment.

Although the semiconductor layer 190 is as shallow as the second base layer 130, the gate electrode 160 is formed to be relatively short. Due to this, according to the seventeenth embodiment, the gate-collector capacity $C_{GC}$ can be reduced as compared with the conventional semiconductor device. Further, according to the seventeenth embodiment, since the bottom semiconductor layer 200 covers the bottom of each trench 155, the gate-collector capacity $C_{GC}$ can be further reduced. In addition, the seventeenth embodiment exhibits the same advantages as those of the sixteenth embodiment.

The semiconductor layer 190 may be formed to be deep similarly to the fourteenth embodiment. The insulating film 150 may be thicker than the gate insulating film on the bottom of the trench 155. The insulating film 150 may be thicker than the gate insulating film on the space section-side side surface of the trench 155.

In the seventeenth embodiment, the semiconductor layer 190 and the bottom semiconductor layer 200 may be formed of an n-type semiconductor higher in impurity concentration than the first base layer 110. The n-type bottom semiconductor layer 200 enables further improving the IE effect. In addition, the n-type semiconductor layer 210 and the n-type bottom semiconductor layer 200 enable accelerating lateral diffusion of injected electrons and further reducing the ON voltage.

With this structure, the IE effect is partially reduced because of the shallow trenches 155. However, as described in the fourth embodiment, if the bottom semiconductor layer 200 is the n-type semiconductor higher in impurity concentration, then the width of the trench 155 is substantially smaller and the IE effect can be maintained. Therefore, the ON voltage reduction effect is produced. Besides, since the trenches 155 are shallow, the semiconductor device 1700 can be advantageously easily manufactured.

(Eighteenth Embodiment)

Figure 19:
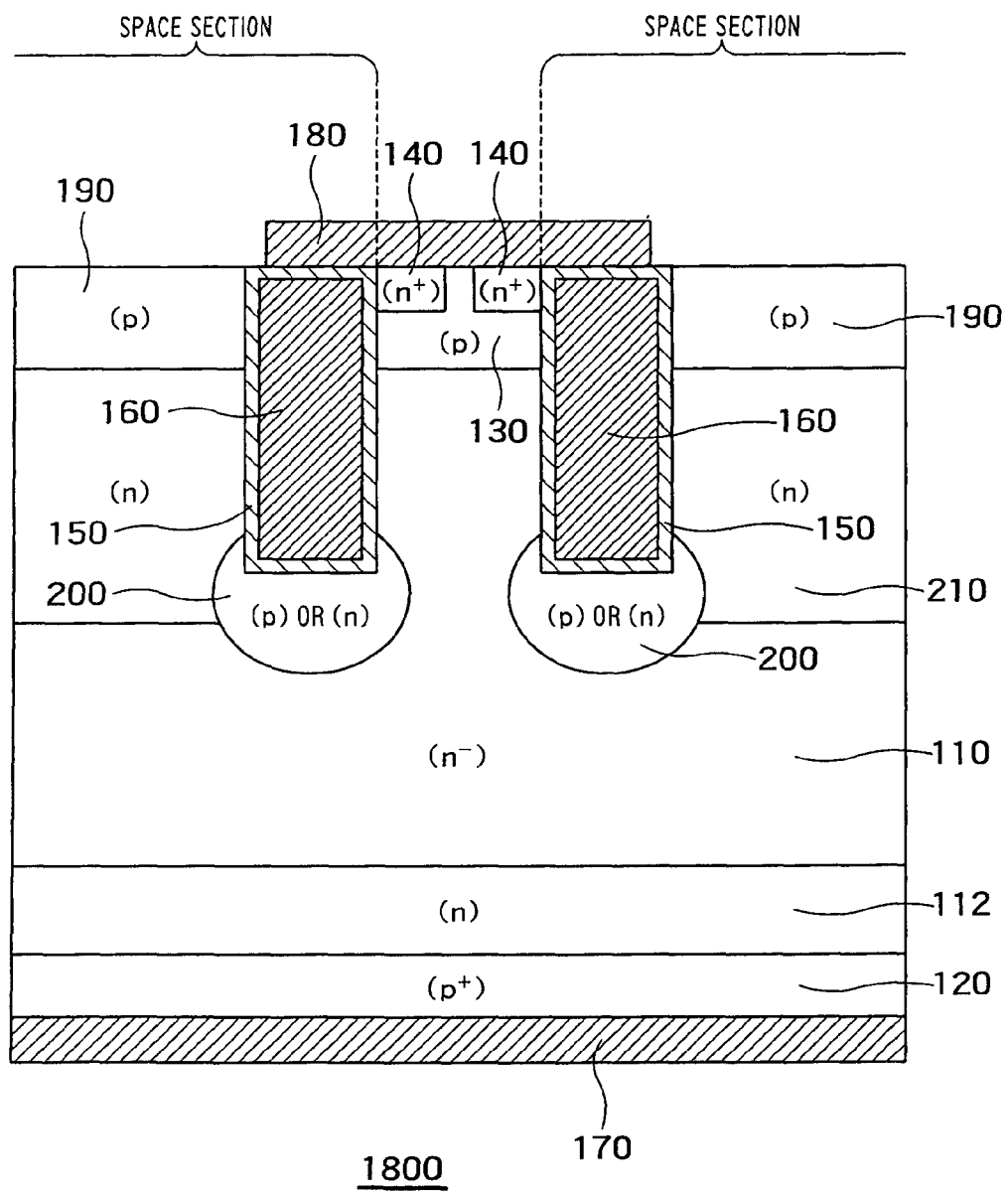
FIG. 19 is a cross-sectional view of a MOS semiconductor device 1800 according to an eighteenth embodiment of the present invention.

FIG. 19 is a cross-sectional view of a MOS semiconductor device 1800 according to an eighteenth embodiment of the present invention. The eighteenth embodiment differs from the sixteenth embodiment by further forming an n-type semiconductor layer 210, which is higher in impurity concentration than the first base layer 110, below the p-type semiconductor layer 190.

According to the eighteenth embodiment, the IE effect can be improved by the n-type bottom semiconductor layer 200. In addition, according to the eighteenth embodiment, the n-type semiconductor layer 210 and the n-type bottom semiconductor layer 200 enable accelerating lateral diffusion of injected electrons and further reducing the ON voltage. The eighteenth embodiment exhibits the same advantages as those of the sixteenth embodiment. The insulating film 150 may be thicker than the gate insulating film on the bottom of the trench 155. The insulating film 150 may be thicker than the gate insulating film on the space section-side side surface of the trench 155.

(Nineteenth Embodiment)

Figure 20:
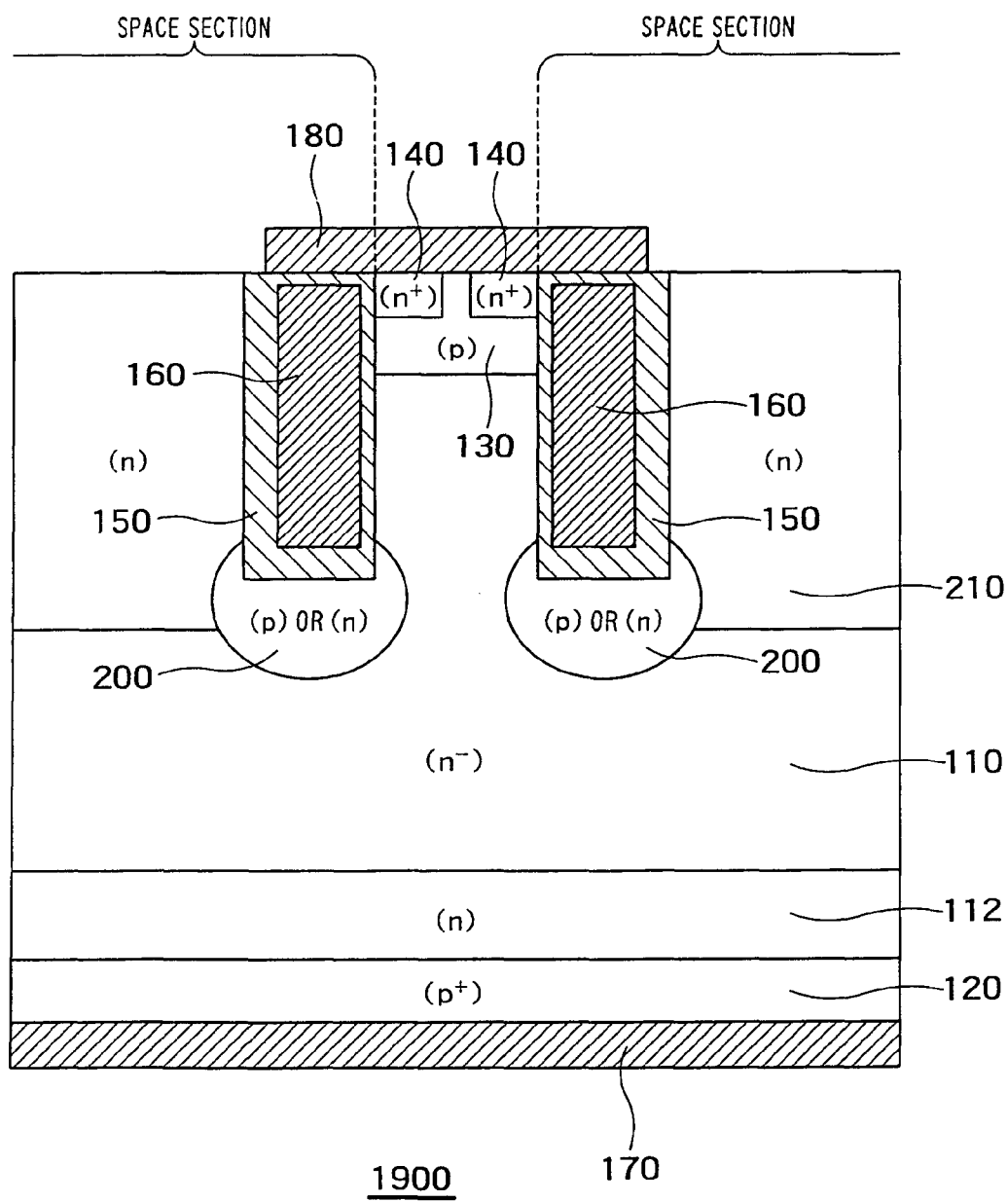
FIG. 20 is a cross-sectional view of a MOS semiconductor device 1900 according to a nineteenth embodiment of the present invention.

FIG. 20 is a cross-sectional view of a MOS semiconductor device 1900 according to a nineteenth embodiment of the present invention. The nineteenth embodiment differs from the eighteenth embodiment in that the p-type semiconductor layer 190 is not formed and in that the n-type semiconductor layer 210 higher in impurity concentration than the first base layer 110 is formed in a surface of the space section.

According to the nineteenth embodiment, the n-type semiconductor layer 210 and the n-type bottom semiconductor layer 200 enable accelerating lateral diffusion of injected electrons and further reducing the ON voltage. The nineteenth embodiment exhibits the same advantages as those of the eighteenth embodiment.

In the nineteenth embodiment, the bottom semiconductor layer 200 may be formed of an n-type semiconductor higher in impurity concentration than the first base layer 110. By so forming, the IE effect can be improved.

(Twentieth Embodiment)

Figure 21:
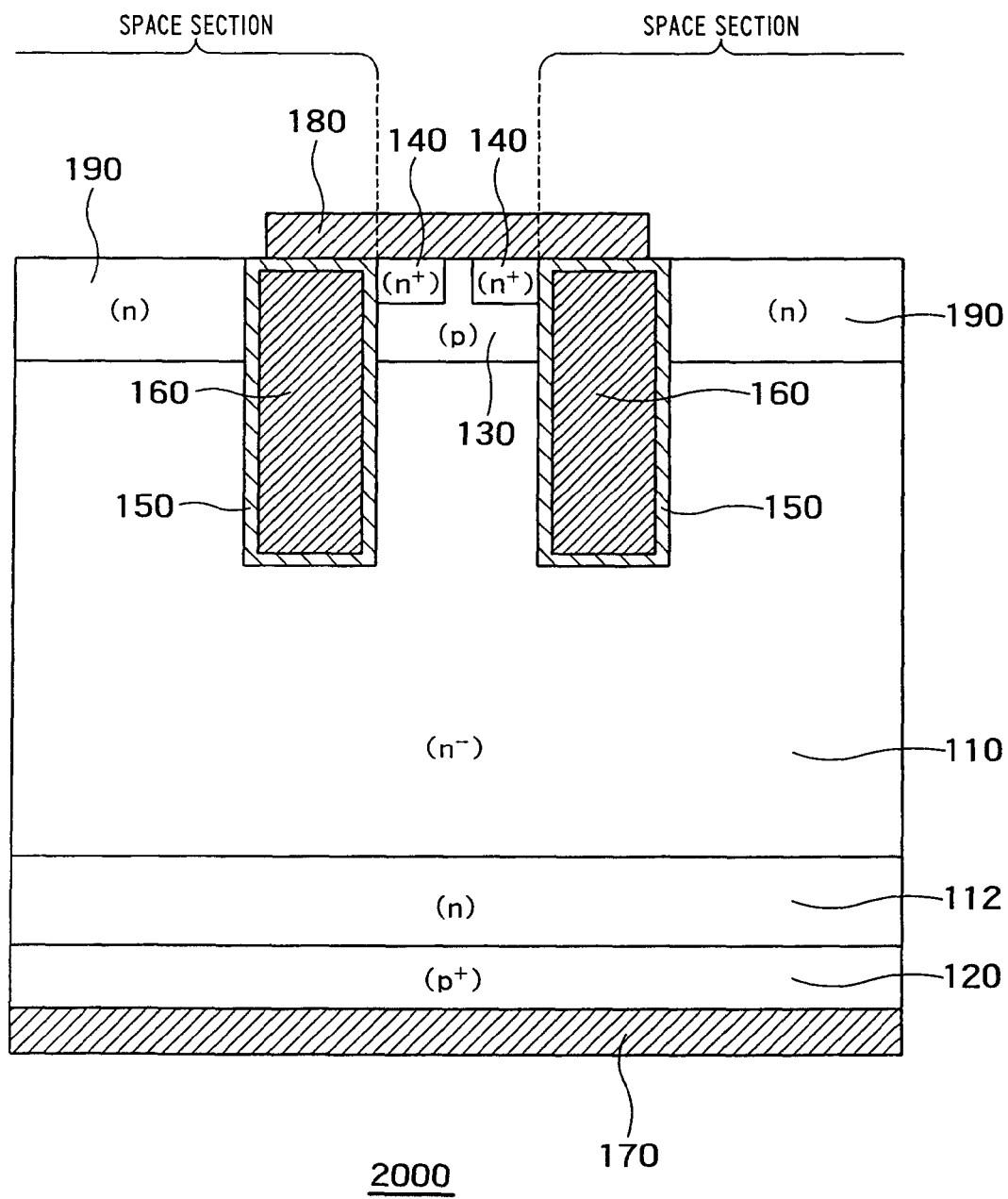
FIG. 21 is a cross-sectional view of a MOS semiconductor device 2000 according to a twentieth embodiment of the present invention.

FIG. 21 is a cross-sectional view of a MOS semiconductor device 2000 according to a twentieth embodiment of the present invention. In the twentieth embodiment, the n-type semiconductor layer 190 higher in impurity concentration than the first base layer 110 is formed in each space section. The depth of the semiconductor layer 190 is not particularly limited. Therefore, the depth of the semiconductor layer 190 may be equal to that of the second base layer 130.

According to the twentieth embodiment, the n-type semiconductor layer 190 enables accelerating lateral diffusion of injected electrons and further reducing the ON voltage. In the twentieth embodiment, similarly to the nineteenth embodiment, the bottom semiconductor layer 200 may be formed on the bottom of each trench 155. By so forming, the gate-collector capacity $C_{GC}$ can be reduced.

(Twenty-First Embodiment)

Figure 22:
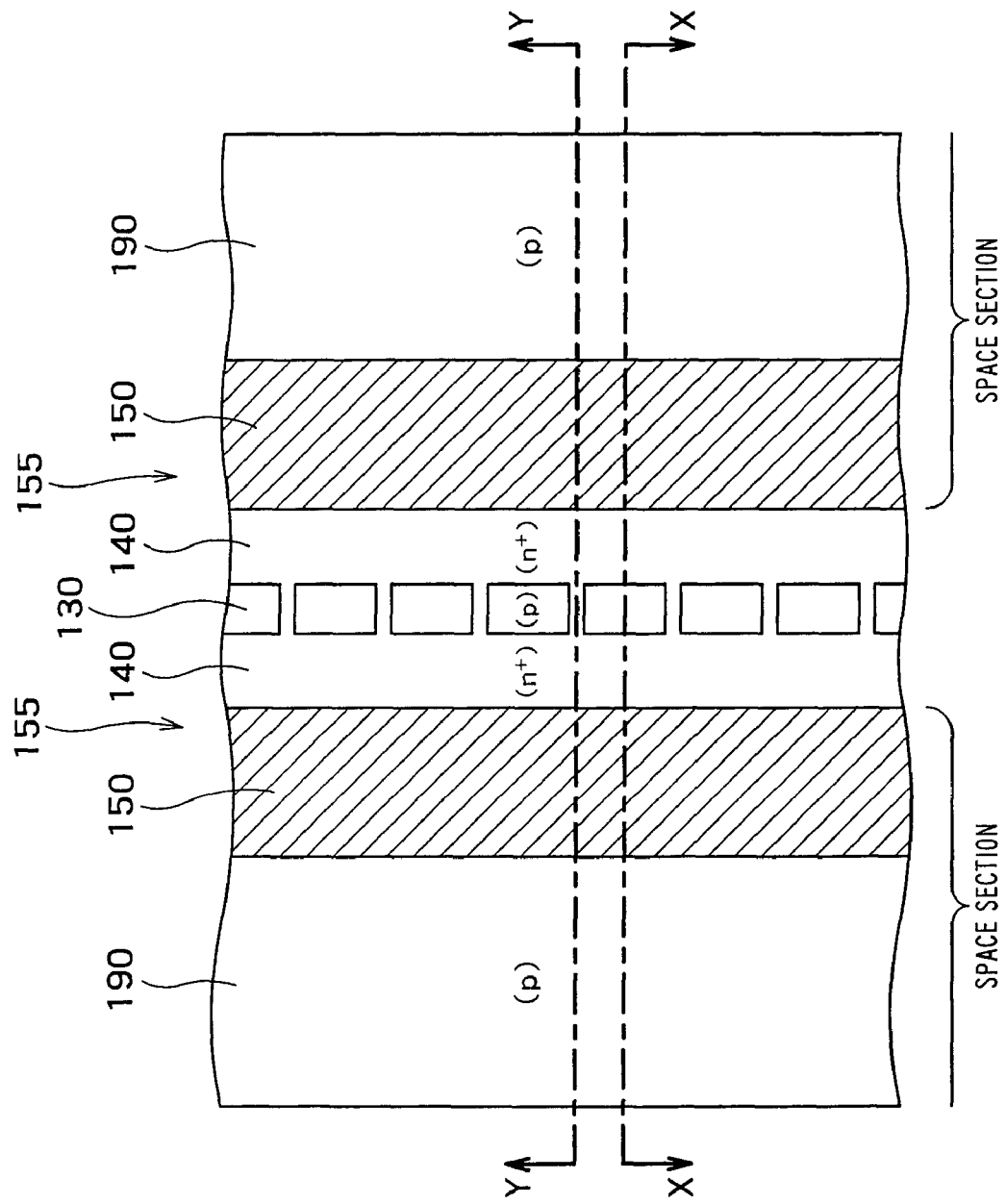
FIG. 22 is a plan view showing a thirteenth embodiment in which an emitter layer 140 is ladder-formed.

In the first to the nineteenth embodiments, the trenches 155, the emitter layers 140, and the second base layer 130 may be formed into stripes in a plan view as shown in FIG. 2. Alternatively, as shown in FIG. 22, the emitter layers 140 may be ladder-formed in these embodiments. In this case, an X-X cross section of FIG. 22 is equal to the cross sections of FIGS. 1 and 3 to 20. In a Y-Y cross section of FIG. 22, the emitter layers 140 are apparently formed entirely on the surface of the second base layer 130, and the emitter electrode 180 is not in direct contact with the third base layer 130. In FIGS. 2 and 22, the insulating film 150 or the emitter electrode 180 appears in the region of the semiconductor layer 190 according to the fourth to the thirteenth embodiments.

In the twenty-first embodiment, the emitter layers 140 are ladder-formed, thereby integrating the emitter layers 140 as a whole. Therefore a contact resistance of the emitter layers 140 for contacting with the emitter electrode 180 is reduced. It is thereby possible to prevent latch-up of the emitter layers 140. As a consequence, a fracture tolerance of the semiconductor device according to the twenty-first embodiment can be improved.

(Twenty-Second Embodiment)

In the first to the twentieth embodiments, the trenches 155, the emitter layers 140, and the second base layer 130 are formed into stripes in parallel to the trenches 155 in a plan view as shown in FIG. 2. Alternatively, in these embodiments, the emitter layers 140 and the second base layer 130 may be formed into stripes vertically to the trenches 155 as shown in FIG. 23.

In the twenty-second embodiment, the emitter layer 140 is formed to be divided into small segments, thereby reducing a resistance of the p-type base in the lower portion of the emitter layer 140. It is thereby possible to prevent latch-up of the emitter layer 140. As a consequence, a fracture tolerance of the semiconductor device according to the twenty-second embodiment can be improved.

(Twenty-Third Embodiment)

Figure 23:
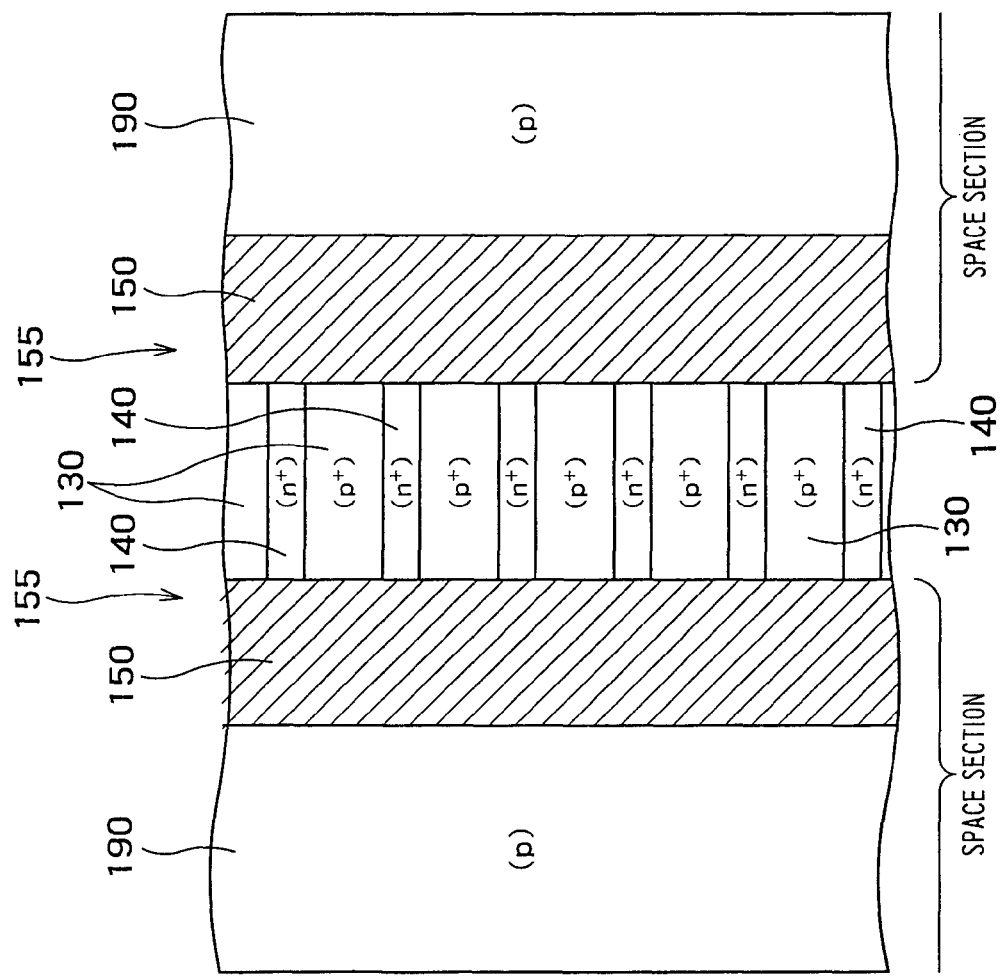
FIG. 23 is a plan view showing a twenty-first embodiment in which emitter layers 140 are formed into stripes vertically to trenches.
Figure 24:
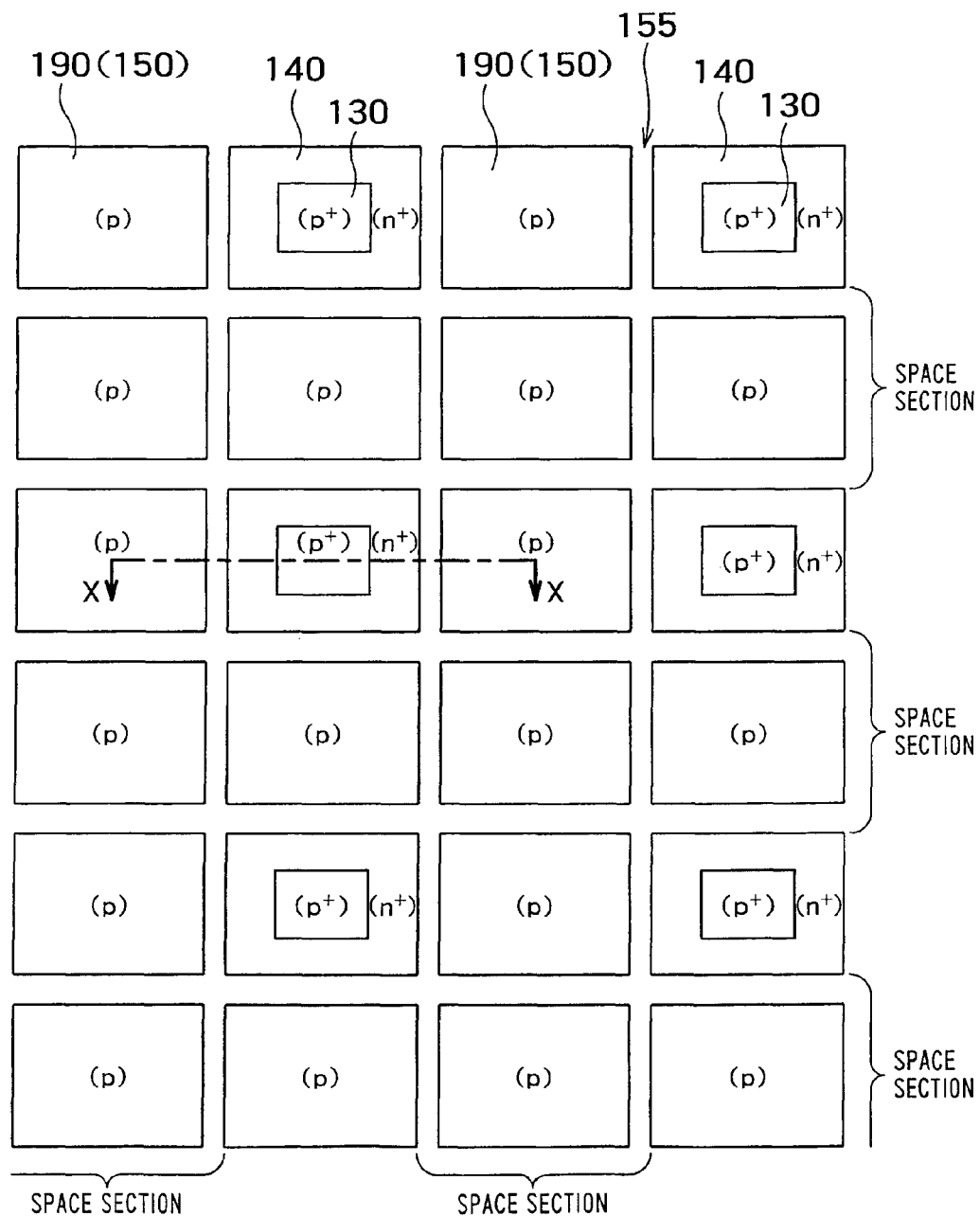
FIG. 24 is a plan view showing a fourteenth embodiment in which trenches 155 are mesh-formed.

In the first to the twenty-second embodiments, the trenches 155 are formed into stripes in a plan view as shown in FIG. 2, 22 or 23. However, in a twenty-third embodiment shown in FIG. 24, the trenches 155 are mesh-formed. One second base layer 130 and one emitter layer 140 are formed in a grid region surrounded by the mesh-formed trenches 155. If it is assumed herein that the grid region in which the second base layer 130 and the emitter layer 140 are formed is a first grid region, the semiconductor layer 190 is formed in a grid region around the first grid regions. It is assumed herein that this grid region in which the semiconductor layer 190 is formed is a second grid region.

In the twenty-third embodiment, the second grid region and the trenches 155 present around the second grid region constitute a space section. As can be seen, even if the trenches 155 are mesh-formed, the same advantages as those of the preceding embodiments can be exhibited. If one of the fourth to the thirteenth embodiments is applied to the twenty-third embodiment, the insulating layer 150, the gate electrode 160 or the emitter electrode 180 is provided in place of the region of the semiconductor layer 190.

(Twenty-Fourth Embodiment)

Figure 25:
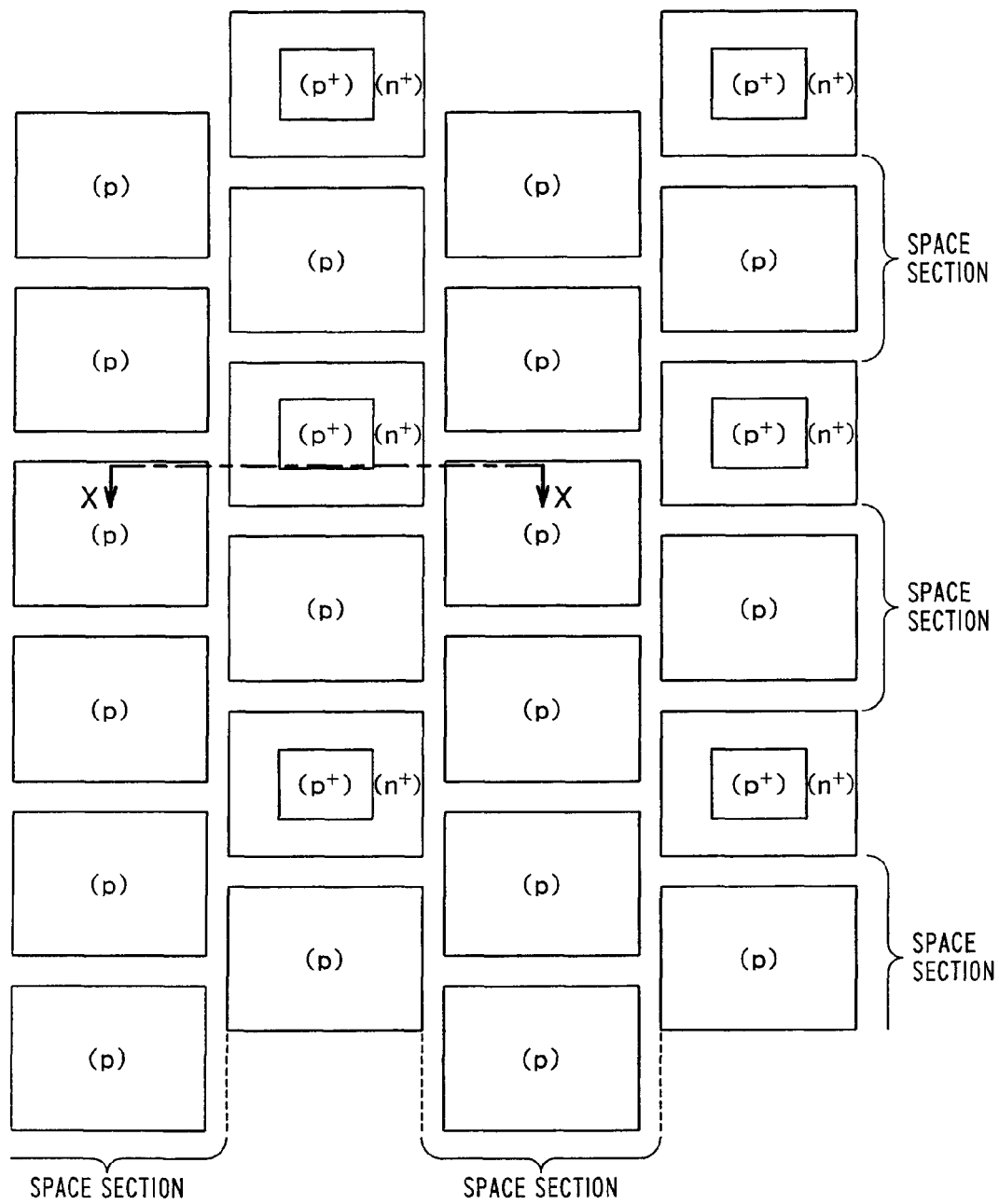
FIG. 25 is a plan view showing a fifteenth embodiment in which trenches 155 are mesh-formed.

A twenty-fourth embodiment shown in FIG. 25 is similar to the twenty-third embodiment in that the trenches 155 are mesh-formed. However, the twenty-fourth embodiment differs from the twenty-third embodiment in that the second grid region present on each side of the first grid region is deviated by half a pitch from the first grid region. Even if pitches of the grid regions differ as in the twenty-fourth embodiment, the same advantages as those of the preceding embodiments can be exhibited by providing the second grid region around the first grid region. If one of the fourth to the thirteenth embodiments is applied to the twenty-fourth embodiment, the insulating layer 150, the gate electrode 160 or the emitter electrode 180 is provided in place of the region of the semiconductor layer 190.

In the first to the twenty-fourth embodiments, the n-type buffer layer 112 is provided so as to maintain the breakdown voltage and to make the first base layer 110 thin. However, it is not always necessary to provide the n-type buffer layer 112 so as to attain the advantages of these embodiments.

Furthermore, the semiconductor devices are described in the embodiments while assuming that they are IGBT's or IEGT's. Alternatively, the present invention can be also applied to the other semiconductor device having the MOS structure, e.g., MOSFET. If the semiconductor device is the MOSFET, the ON voltage is increased as already described. However, the MOSFET is an effective semiconductor device when a priority is put on a reduction in gate capacity. Further, in each of the embodiments, constituent elements formed of the n-type semiconductor may be used in place of those formed of the p-type semiconductor, and constituent elements formed of the p-type semiconductor may be used in place of those formed of the n-type semiconductor.

In each of the embodiments, the structure for realizing both a reduction in the gate-collector capacity $C_{GC}$ and a reduction in the ON voltage is provided. By thickening the gate oxide film in regions other than a channel region, and by adding a diffusion layer to a bottom of a trench gate, the gate-collector capacity $C_{GC}$ is reduced. By forming the space sections out of the channel region as the p- or n-type semiconductor layers, and by increasing the gate width, the ON voltage is reduced. To this end, combinations other than those of the above-stated embodiments are obviously possible.

The invention claimed is:

1. A semiconductor device, comprising:
    a first base layer of a first conductivity type;
    a plurality of second base layers of a second conductivity type provided on a part of a first surface of the first base layer;
    a plurality of trenches formed entirely between the second base layers adjacent to each other, widths of the trenches being wider than those of the second base layers, and depths of the trenches being deeper than those of the second base layers;
    an emitter layer formed along one of the trenches on a surface of one of the second base layers;
    a collector layer of the second conductivity type, provided below a second surface of the first base layer opposite to the first surface;
    a plurality of insulating films formed on inside surfaces of the trenches; and
    a space section including at least a gate electrode formed within each trench, and isolated from the second base layers and the emitter layer by one of the insulating films, wherein
    a plurality of gate electrodes are provided in each trench, respectively; and
    the device further comprises an intervention insulating film filled between the gate electrodes in each trench.

2. The semiconductor device according to claim 1, wherein each gate electrode is filled between the insulating films provided on both side surfaces of each trench.

3. The semiconductor device according to claim 1, wherein each gate electrode is provided within each trench through the insulating film; and
    the device further comprises an inside insulating film filled inside of the gate electrode.

4. The semiconductor device according to claim 1 further comprising:
    an emitter electrode formed between the gate electrodes through the insulating film.

5. The semiconductor device according to claim 1, wherein the gate electrodes are provided in an upper portion of each trench.

6. The semiconductor device according to claim 1, further comprising:
    bottom semiconductor layers respectively provided below bottoms of the trenches, the bottom semiconductor layers having the first conductivity type higher in impurity concentration than the first base layer,
    wherein a width between the bottom semiconductor layers adjacent to each other is smaller than a width between the trenches adjacent to each other.

7. The semiconductor device according to claim 1, wherein the insulating films are thicker on bottoms of the trenches than on side surfaces of the trenches.

8. A semiconductor device, comprising:
a first base layer of a first conductivity type;
a plurality of second base layers of a second conductivity type provided on a part of a first surface of the first base layer;
a plurality of trenches formed on both sides of the second base layers;
an emitter layer formed along one of the trenches on a surface of the second base layers;
a collector layer of the second conductivity type provided below a second surface of the first base layer opposite to the first surface;
a plurality of insulating films formed on inside surfaces of the trenches;
a plurality of gate electrodes formed along side surfaces of each trench, and isolated from the second base layers and the emitter layer by the insulating films; and
a plurality of intervention insulating films filled between the gate electrodes in each trench, wherein
the trenches are formed entirely between the second base layers adjacent to each other, widths of the trenches are wider than those of the second base layers, and depths of the trenches are deeper than those of the second base layers; and
space sections including the gate electrodes are formed within the trenches.

9. The semiconductor device according to claim 8, wherein the gate electrodes are provided in an upper portion of each trench.

10. The semiconductor device according to claim 8, further comprising:
an emitter electrode formed between the gate electrodes through the insulating films.

11. The semiconductor device according to claim 8, wherein each gate electrode is filled between the insulating films provided on both side surfaces of each trench.

12. The semiconductor device according to claim 8, wherein
each gate electrode is provided within each trench through the insulating film; and
the device further comprises an inside insulating film filling an inside of the gate electrode.

13. The semiconductor device according to claim 8, wherein the insulating films are thicker on bottoms of the trenches than on side surfaces of the trenches.

* * * * *